United States Patent
Kang et al.

(10) Patent No.: US 12,230,667 B2
(45) Date of Patent: Feb. 18, 2025

(54) SEMICONDUCTOR DEVICE INCLUDING CAPACITOR AND METHOD OF FORMING THE SAME

(71) Applicants: Samsung Electronics Co., Ltd., Suwon-si (KR); SEOUL NATIONAL UNIVERSITY R&DB FOUNDATION, Seoul (KR)

(72) Inventors: Sang Yeol Kang, Hwaseong-si (KR); Kyu Ho Cho, Hwaseong-si (KR); Han Jin Lim, Hwaseong-si (KR); Cheol Seong Hwang, Hwaseong-si (KR)

(73) Assignees: Samsung Electronics Co., Ltd., Gyeonggi-do (KR); SEOUL NATIONAL UNIVERISTY R&DB FOUNDATION, Seoul (KR)

( * ) Notice: Subject to any disclaimer, the term of this patent is extended or adjusted under 35 U.S.C. 154(b) by 295 days.

(21) Appl. No.: 17/854,679

(22) Filed: Jun. 30, 2022

(65) Prior Publication Data
US 2022/0336574 A1 Oct. 20, 2022

Related U.S. Application Data

(63) Continuation of application No. 17/030,678, filed on Sep. 24, 2020, now Pat. No. 11,411,069, which is a
(Continued)

(30) Foreign Application Priority Data

Jan. 11, 2018 (KR) ........................ 10-2018-0003724

(51) Int. Cl.
*H10B 12/00* (2023.01)
*H01L 49/02* (2006.01)

(52) U.S. Cl.
CPC .............. *H01L 28/55* (2013.01); *H01L 28/65* (2013.01); *H01L 28/75* (2013.01); *H01L 28/90* (2013.01);
(Continued)

(58) Field of Classification Search
CPC ......... H01L 28/55; H01L 28/65; H01L 28/75; H01L 28/90; H01L 28/91; H10B 12/0335; H10B 12/34; H10B 12/315
See application file for complete search history.

(56) References Cited

U.S. PATENT DOCUMENTS 7,312,130 B2   12/2007   Kim et al.
7,939,910 B2   5/2011    Cho et al.
(Continued)

FOREIGN PATENT DOCUMENTS

JP    2011-066062 A    3/2011
KR    10-0572382 B1    4/2006
(Continued)

*Primary Examiner* — Mohammad M Choudhry
(74) *Attorney, Agent, or Firm* — Harness, Dickey & Pierce, P.L.C.

(57) ABSTRACT

A semiconductor device including a switching element on a substrate, a pad isolation layer on the switching element, a conductive pad passing through the pad isolation layer and connected to the switching element, an insulating pattern on the pad isolation layer and having a height greater than a horizontal width, a lower electrode on side surfaces of the insulating pattern on side surfaces of the insulating pattern and in contact with the conductive pad, a capacitor dielectric layer on the lower electrode and having a monocrystalline dielectric layer and a polycrystalline dielectric layer, the monocrystalline dielectric layer being relatively close to side surfaces of the insulating pattern compared to the polycrystalline dielectric layer an upper electrode on the capacitor dielectric layer may be provided.

20 Claims, 20 Drawing Sheets

Related U.S. Application Data continuation of application No. 16/012,997, filed on Jun. 20, 2018, now Pat. No. 10,825,889.

(52) U.S. Cl.
CPC ......... *H01L 28/91* (2013.01); *H10B 12/0335* (2023.02); *H10B 12/315* (2023.02); *H10B 12/34* (2023.02)

(56) References Cited

U.S. PATENT DOCUMENTS

| | | |
|---|---|---|
| 8,482,044 B2 | 7/2013 | Hamamoto |
| 9,070,640 B2 | 6/2015 | Gwak |
| 9,608,204 B2 | 3/2017 | Lee et al. |
| 9,716,094 B2 | 7/2017 | Kang et al. |
| 9,761,715 B2 | 9/2017 | Ramaswamy et al. |
| 2001/0054728 A1 | 12/2001 | Paz de Araujo et al. |
| 2003/0022395 A1 | 1/2003 | Olds |
| 2004/0157357 A1 | 8/2004 | Liang et al. |
| 2005/0230725 A1 | 10/2005 | Aggarwal et al. |
| 2005/0269671 A1 | 12/2005 | Faure et al. |
| 2006/0180938 A1 | 8/2006 | Kurihara et al. |
| 2007/0029593 A1 | 2/2007 | Ramesh |
| 2012/0112167 A1 | 5/2012 | Ribeiro et al. |
| 2012/0276721 A1 | 11/2012 | Chung et al. |
| 2013/0076275 A1 | 3/2013 | Cohen et al. |
| 2013/0102150 A1* | 4/2013 | Oh .................. H10N 70/20 257/E21.585 |
| 2013/0277724 A1 | 10/2013 | Jun |
| 2014/0273471 A1 | 9/2014 | Gwak |
| 2014/0293180 A1 | 10/2014 | Hong et al. |
| 2015/0013746 A1 | 1/2015 | Shukh |
| 2015/0035096 A1* | 2/2015 | Han .................. H10B 61/22 257/421 |
| 2016/0035961 A1 | 2/2016 | Noda et al. |
| 2016/0149083 A1 | 5/2016 | Faurie et al. |
| 2019/0122824 A1 | 4/2019 | Lien et al. |

FOREIGN PATENT DOCUMENTS

| | | |
|---|---|---|
| KR | 10-0720265 B1 | 5/2007 |
| KR | 10-2012-0122887 A | 11/2012 |
| KR | 10-2014-0113112 A | 9/2014 |
| KR | 10-2016-0015126 A | 2/2016 |

* cited by examiner

SEMICONDUCTOR DEVICE INCLUDING CAPACITOR AND METHOD OF FORMING THE SAME

CROSS-REFERENCE TO RELATED APPLICATION

This U.S. non-provisional patent application is a continuation of U.S. application Ser. No. 17/030,678, filed on Sep. 24, 2020, which is a continuation of U.S. application Ser. No. 16/012,997, filed on Jun. 20, 2018, now granted as U.S. Pat. No. 10,825,889 on Nov. 3, 2020, which claims priority under 35 U.S.C. § 119 to and the benefit of Korean Patent Application No. 10-2018-0003724, filed on Jan. 11, 2018, in the Korean Intellectual Property Office (KIPO), the disclosure of each of which is incorporated herein by reference in its entirety.

BACKGROUND

1. Field of the Invention

The present inventive concepts relate to semiconductor devices having a capacitor and/or methods of fabricating the same.

2. Discussion of Related Art

Research is underway to develop various methods for maximizing capacitance while reducing a size of a capacitor in a highly integrated semiconductor device. Electrode layers are arranged in three dimensions, and a capacitor dielectric layer is interposed between the electrode layers. As a thickness of the capacitor dielectric layer is reduced to increase capacitance, the thick reduction is limited due to an increase in leakage current.

SUMMARY

The present inventive concepts are directed to a semiconductor device including a capacitor having an increased capacitance value and a reduced leakage current.

In addition, the present inventive concepts are directed to a method of fabricating a semiconductor device having such a capacitor.

A semiconductor device according to an example embodiment of the present inventive concepts may include a switching element on a substrate, a pad isolation layer on the switching element, a conductive pad configured to pass through the pad isolation layer and in contact with the switching element, an insulating pattern on the pad isolation layer and configured to have a height greater than a horizontal width, a lower electrode on side surfaces of the insulating pattern and in contact with the conductive pad, a capacitor dielectric layer on the lower electrode and including a monocrystalline dielectric layer and a polycrystalline dielectric layer, the monocrystalline dielectric layer being relatively close to side surfaces of the insulating pattern compared to the polycrystalline dielectric layer, and an upper electrode on the capacitor dielectric layer.

A semiconductor device according to an example embodiment of the present inventive concepts may include a first conductive pad and a second conductive pad apart from the first conductive pad, a pad isolation layer between the first conductive pad and the second conductive pad, an insulating pattern on the pad isolation layer and configured to have a height greater than a horizontal width, a first lower electrode on a first side surface of the insulating pattern and in contact with the first conductive pad, a second lower electrode on a second side surface of the insulating pattern and in contact with the second conductive pad, a capacitor dielectric layer covering the first and second lower electrodes, the insulating pattern, and the pad isolation layer, and having a monocrystalline dielectric layer and a polycrystalline dielectric layer, the monocrystalline dielectric layer being relatively close to first and second side surfaces of the insulating pattern compared to the polycrystalline dielectric layer, an upper on the capacitor dielectric layer.

A semiconductor device according to an example embodiment of the present inventive concepts may include a conductive pad on a substrate, a pad isolation layer on the substrate and configured to surround the conductive pad, an insulating pattern on the pad isolation layer and configured to have a height greater than a horizontal width, a lower electrode on a side surface of the insulating pattern and in contact with the conductive pad, a seed layer between the insulating pattern and the lower electrode and having a monocrystalline material, a capacitor dielectric layer on the lower electrode, and an upper electrode on the capacitor dielectric layer.

A method of fabricating a semiconductor device according to an example embodiment of the present inventive concepts may include forming a conductive pad on a substrate, forming a pad isolation layer to surround to surround conductive pad, forming a sacrificial pattern having a height greater than a horizontal width on the pad isolation layer, the sacrificial pattern including at least one of a monocrystalline Ge layer, a monocrystalline Si layer, a monocrystalline SiC layer, a monocrystalline SiGe layer, or a combination thereof, forming a lower electrode to contact the conductive pad and to be on a side surface of the sacrificial pattern, the lower electrode including a monocrystalline lower conductive layer, forming a trench by removing the sacrificial pattern, forming an insulating pattern in the trench to have a height greater than a horizontal width, forming a capacitor dielectric layer to cover a side surface and an upper surface of the insulating pattern and to be on the lower electrode, the capacitor dielectric layer including a monocrystalline dielectric layer, and forming an upper electrode on the capacitor dielectric layer.

BRIEF DESCRIPTION OF THE DRAWINGS

The above and other objects, features and advantages of the present inventive concepts will become more apparent to those of ordinary skill in the art by describing some example embodiments thereof in detail with reference to the accompanying drawings, in which.

DETAILED DESCRIPTION

Figure 1:
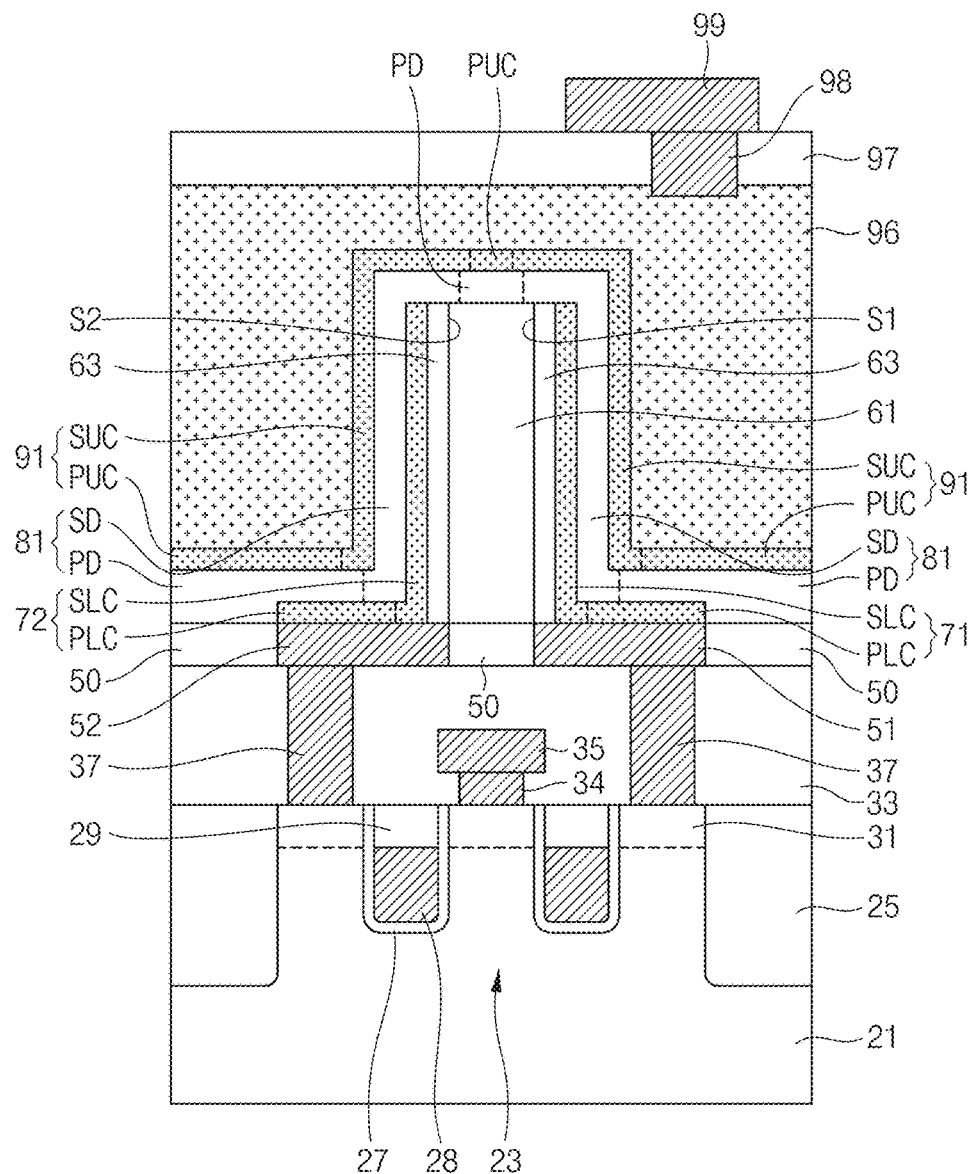
FIG. 1 is a cross-sectional view illustrating a semiconductor device according to an example embodiment of the present inventive concepts.

FIG. 1 is a cross-sectional view illustrating a semiconductor device according to an example embodiment of the present inventive concepts. In an example embodiment, the semiconductor device may include a dynamic random access memory (DRAM).

Referring to FIG. 1, the semiconductor device may include a substrate 21, an active region 23, an isolation layer 25, gate dielectric layers 27, gate electrodes 28, a gate capping layers 29, source/drain regions 31, an interlayer insulating layer 33, a bit contact plug 34, a bit line 35, buried contact plugs 37, a pad isolation layer 50, a plurality of conductive pads 51 and 52, an insulating pattern 61, seed layers 63, a plurality of lower electrodes 71 and 72, a capacitor dielectric layer 81, an upper electrode 91, an additional electrode 96, an upper insulating layer 97, an upper contact plug 98, and an upper interconnection 99.

The plurality of conductive pads 51 and 52 may include a first conductive pad 51 and a second conductive pad 52. The plurality of lower electrodes 71 and 72 may include a first lower electrode 71 and a second lower electrode 72. Each of the plurality of lower electrodes 71 and 72 may include a monocrystalline perovskite lower conductive layer SLC and a polycrystalline perovskite lower conductive layer PLC. The capacitor dielectric layer 81 may include monocrystalline perovskite dielectric layers SD and polycrystalline perovskite dielectric layers PD. The upper electrode 91 may include monocrystalline perovskite upper conductive layers SUC and polycrystalline perovskite upper conductive layers PUC.

The substrate 21 may include a semiconductor substrate, for example, a silicon wafer or a silicon on insulator (SOI) wafer. The isolation layer 25 for limiting the active region 23 may be formed on the substrate 21. The isolation layer 25 may include an insulating material, for example, silicon oxide, silicon nitride, silicon oxynitride, silicon oxycarbonitride (SiOCN), low-K dielectric, high-K dielectric, or a combination thereof.

In the active region 23, the gate dielectric layers 27, the gate electrodes 28, and the gate capping layers 29 may be stacked in sequence. The source/drain regions 31 may be formed in the active region 23 adjacent to both sides of the gate electrodes 28. The gate dielectric layers 27 may be interposed between the active region 23 and the gate electrodes 28. The gate dielectric layers 27 may include an insulating material, for example, silicon oxide, silicon nitride, silicon oxynitride, high-K dielectric, or a combination thereof. The gate electrodes 28 may be formed at a lower level than an upper end of the active region 23. The gate electrodes 28 may include a conductive material, for example, metal, metal nitride, metal oxide, metal silicide, polysilicon, conductive carbon, or a combination thereof. Each of the gate electrodes 28 may correspond to a word line. The gate capping layers 29 may cover upper surfaces of the gate electrodes 28. The gate capping layers 29 may include an insulating material, for example, silicon oxide, silicon nitride, silicon oxynitride, silicon oxycarbonitride, low-K dielectric, high-K dielectric, or a combination thereof. The source/drain regions 31 may include conductive impurities different from those of the active region 23. For example, the active region 23 may include P-type impurities, and the source/drain regions 31 may include N-type impurities.

The interlayer insulating layer 33 may cover the active region 23, the isolation layer 25, the gate dielectric layers 27, the gate electrodes 28, the gate capping layers 29, and the source/drain regions 31. The interlayer insulating layer 33 may include an insulating layer, for example, silicon oxide, silicon nitride, silicon oxynitride, silicon oxycarbonitride, low-K dielectric, high-K dielectric, or a combination thereof.

The bit contact plug 34 and the bit line 35 may be formed in the interlayer insulating layer 33. The bit line 35 may be connected to a selected one of the source/drain regions 31 via the bit contact plug 34. The buried contact plugs 37 may be formed in the interlayer insulating layer 33. Each of the buried contact plugs 37 may pass through the interlayer insulating layer 33, and may be connected to a selected one of the source/drain regions 31. The bit contact plug 34, the bit line 35, and the buried contact plugs 37 may include a conductive material, for example, metal, metal nitride, metal oxide, metal silicide, polysilicon, conductive carbon, or a combination thereof.

The pad isolation layer 50 and the plurality of conductive pads 51 and 52 may be formed on the interlayer insulating layer 33. Each of the plurality of conductive pads 51 and 52 may pass through the pad isolation layer 50 and may be connected to a selected one of the buried contact plugs 37. The pad isolation layer 50 may be disposed between the plurality of conductive pads 51 and 52.

The active region 23, the gate dielectric layers 27, the gate electrodes 28, and the source/drain regions 31 may constitute a plurality of transistors. In an example embodiment, each of the plurality of transistors may serve as a switching element. In an example embodiment, the switching elements may be configured as other active/passive elements, for example, diodes. The plurality of conductive pads 51 and 52 may be connected to the source/drain regions 31 via the buried contact plugs 37. Each of the plurality of conductive pads 51 and 52 may be construed as being connected to a switching element via a selected one of the buried contact plugs 37.

Each of the plurality of conductive pads 51 and 52 may be surrounded by the pad isolation layer 50. The insulating pattern 61 may be formed on the pad isolation layer 50 between the first conductive pad 51 and the second conductive pad 52. The insulating pattern 61 may have a height greater than a horizontal width thereof. The insulating pattern 61 may include a first side surface S1 and a second side surface S2 opposite to the first side surface S1. The first side surface S1 may be adjacent to the first conductive pad 51, and the second side surface S2 may be adjacent to the second conductive pad 52. The seed layers 63 may be formed next to the side surfaces S1 and S2 of the insulating pattern 61.

The plurality of lower electrodes 71 and 72 may be formed on the outer sides of the seed layers 63. The first lower electrode 71 may be adjacent to the first side surface S1, and may be in contact with one seed layer 63 and the first conductive pad 51. The second lower electrode 72 may be adjacent to the second side surface S2 and may be in contact with the other seed layer 63 and the second conductive pad 52. The seed layers 63 may be interposed between the first lower electrode 71 and the first side surface S1 and between the second lower electrode 72 and the second side surface S2.

Compared to the polycrystalline perovskite lower conductive layers PLC, the monocrystalline perovskite lower conductive layers SLC may be formed relatively close to the seed layers 63. The monocrystalline perovskite lower conductive layers SLC may come in direct contact with the seed layers 63 and the plurality of conductive pads 51 and 52. The polycrystalline perovskite lower conductive layers PLC may come in direct contact with the plurality of conductive pads 51 and 52. In an example embodiment, the plurality of lower electrodes 71 and 72 may be entirely formed of the monocrystalline perovskite lower conductive layers SLC.

The capacitor dielectric layer 81 may cover the plurality of lower electrodes 71 and 72, and cover an upper surface of the insulating pattern 61, upper surfaces of the seed layers 63, and the pad isolation layer 50. Compared to the polycrystalline perovskite dielectric layers PD, the monocrystalline perovskite dielectric layers SD may be formed relatively close to the side surfaces S1 and S2 of the insulating pattern 61 and the seed layers 63. Compared to the polycrystalline perovskite dielectric layers PD, the monocrystalline perovskite dielectric layers SD may be formed relatively close to the monocrystalline perovskite lower conductive layers SLC. The monocrystalline perovskite dielectric layers SD may come in direct contact with the monocrystalline perovskite lower conductive layers SLC. The polycrystalline perovskite dielectric layers PD may come in direct contact with the polycrystalline perovskite lower conductive layers PLC, the upper surface of the insulating pattern 61, and the pad isolation layer 50. In an example embodiment, the capacitor dielectric layer 81 may be formed entirely of the monocrystalline perovskite dielectric layers SD.

The upper electrode 91 may cover the capacitor dielectric layer 81. Compared to the polycrystalline perovskite upper conductive layers PUC, the monocrystalline perovskite upper conductive layers SUC may be formed relatively close to the monocrystalline perovskite dielectric layers SD. The monocrystalline perovskite upper conductive layers SUC may come in direct contact with the monocrystalline perovskite dielectric layers SD. The polycrystalline perovskite upper conductive layers PUC may come in direct contact with the polycrystalline perovskite dielectric layers PD. In an example embodiment, the upper electrode 91 may be formed entirely of the monocrystalline perovskite upper conductive layers SUC.

The plurality of lower electrodes 71 and 72, the capacitor dielectric layer 81, and the upper electrode 91 may constitute capacitors. Due to the configuration of the insulating pattern 61, the seed layers 63, the plurality of lower electrodes 71 and 72, the capacitor dielectric layer 81, and the upper electrode 91, capacitors having increased capacitance may be implemented to have reduced leakage current.

The additional electrode 96 may be formed on the upper electrode 91. The additional electrode 96 may include a conductive material, for example, metal, metal nitride, metal oxide, metal silicide, polysilicon, conductive carbon, or a combination thereof. The upper insulating layer 97 may be formed on the additional electrode 96. The upper insulating layer 97 may include an insulating material, for example silicon oxide, silicon nitride, silicon oxynitride, silicon oxycarbonitride, low-K dielectric, high-K dielectric, or a combination thereof. The upper contact plug 98 may be formed to pass through the upper insulating layer 97 and to be in contact with the additional electrode 96. The upper interconnection 99 may be formed on the upper insulating layer 97 to be in contact with the upper contact plug 98. The upper contact plug 98 and the upper interconnection 99 may include a conductive material, for example, metal, metal nitride, metal oxide, metal silicide, polysilicon, conductive carbon, or a combination thereof.

In an example embodiment, the first conductive pad 51 and the second conductive pad 52 may constitute one pair of conductive pads. Each of the plurality of lower electrodes 71 and 72 may have an L shape. The first lower electrode 71 and the second lower electrode 72 may be disposed in a mirror-inverted manner with the insulating pattern 61 interposed therebetween. The seed layers 63 may be interposed between the first lower electrode 71 and the insulating pattern 61 and between the second lower electrode 72 and the insulating pattern 61. A lower surface of the insulating pattern 61 may be in contact with an upper surface of the pad isolation layer 50. The first lower electrode 71 and the second lower electrode 72 may constitute one pair of lower electrodes. The first lower electrode 71 may be in contact with an upper surface of the first conductive pad 51, and the second lower electrode 72 may be in contact with an upper surface of the second conductive pad 52. The first lower electrode 71 may be connected to a corresponding one of the plurality of transistors via the first conductive pad 51 and a selected one of the buried contact plugs 37. The second lower electrode 72 may be connected to a corresponding one of the plurality of transistors via the second conductive pad 52 and a selected one of the buried contact plugs 37. Each of the capacitors may be connected to a corresponding one of the plurality of transistors and may constitute a unit cell. The unit cell may include a selected one of the first lower electrode 71 and the second lower electrode 72.

In an example embodiment, the monocrystalline perovskite lower conductive layers SLC, the polycrystalline perovskite lower conductive layers PLC, the monocrystalline perovskite dielectric layers SD, the polycrystalline perovskite dielectric layers PD, the monocrystalline perovskite upper conductive layers SUC, and the polycrystalline perovskite upper conductive layers PUC may be construed as monocrystalline lower conductive layers, polycrystalline conductive layers, monocrystalline dielectric layers, polycrystalline dielectric layers, monocrystalline upper conductive layers, and polycrystalline upper conductive layers, respectively.

Figure 2:
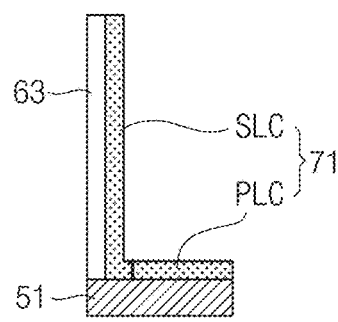
FIGS. 2 and 3 are partial diagrams showing parts of FIG. 1.

Referring to FIG. 2, the first lower electrode 71 may be divided into a monocrystalline perovskite lower conductive layer SLC and a polycrystalline perovskite lower conductive layer PLC in terms of material. A side surface of the monocrystalline perovskite lower conductive layer SLC may come in direct contact with a side surface of a seed layer 63. A lower end of the monocrystalline perovskite lower conductive layer SLC may come in direct contact with the upper surface of the first conductive pad 51. The polycrystalline perovskite lower conductive layer PLC may be in continuity with or may be connected to the monocrystalline perovskite lower conductive layer SLC. The polycrystalline perovskite lower conductive layer PLC may be relatively apart from the seed layer 63, compared to the monocrystalline perovskite lower conductive layer SLC. A lower surface of the polycrystalline perovskite lower conductive layer PLC may come in direct contact with the upper surface of the first conductive pad 51.

Figure 3:
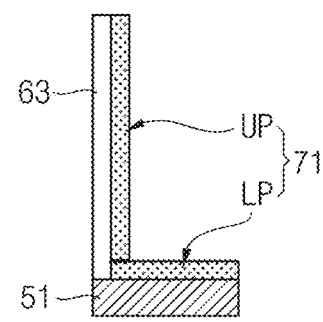

Referring to FIG. 3, the first lower electrode 71 may be divided into a lower region LP and an upper region UP in terms of geometry. The lower region LP may have a horizontal width greater than a height thereof. The lower region LP may come in direct contact with the upper surface of the first conductive pad 51. The upper region UP may be in continuity with or may be connected to the lower region LP. The upper region UP may have a height greater than a horizontal width thereof. A side surface of the upper region UP may come in direct contact with the side surface of the seed layer 63. The first lower electrode 71 may have an L shape.

Figure 4:
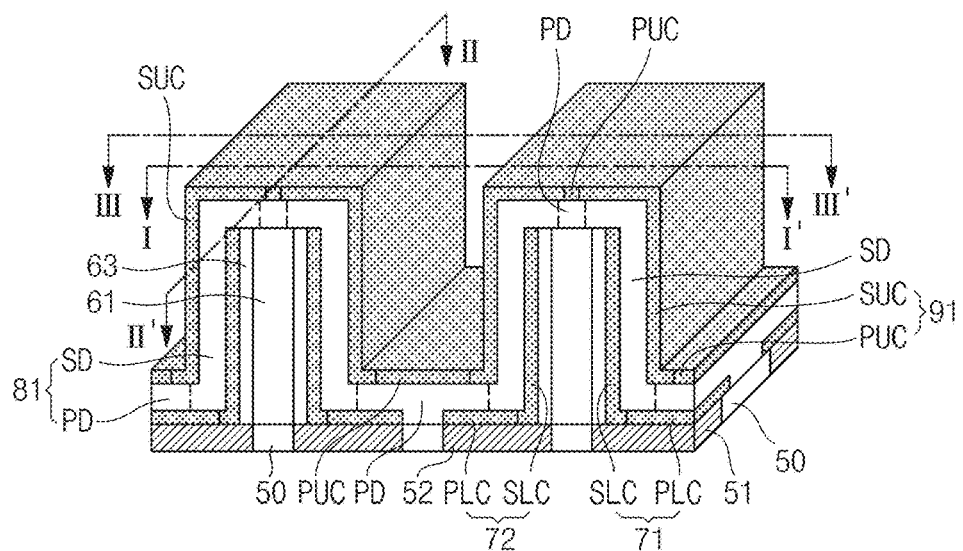
FIGS. 4 and 5 are perspective views showing parts of a semiconductor device according to example embodiments of the present inventive concepts.
Figure 5:
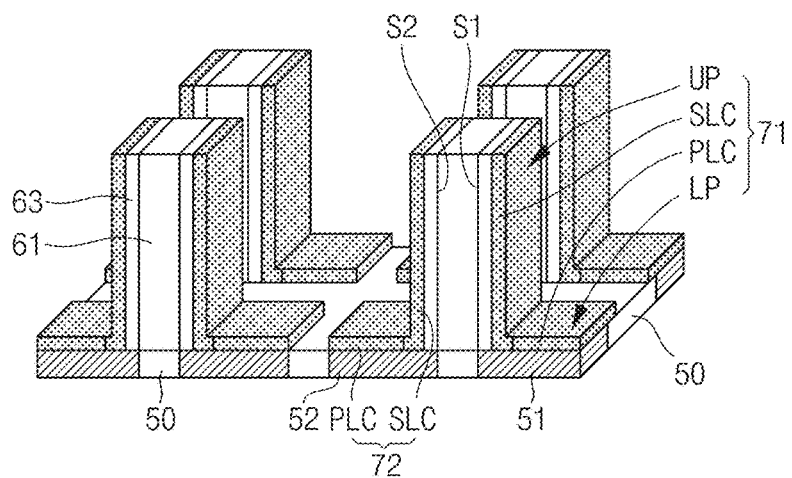
Figure 6:
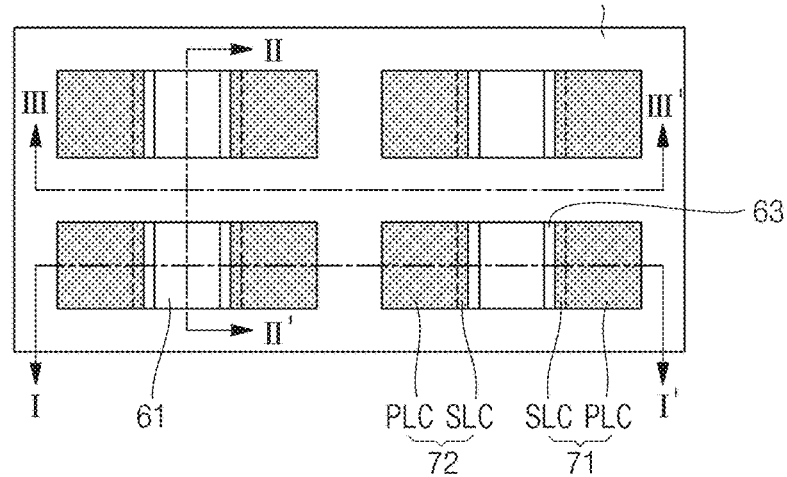
FIG. 6 is a layout showing a part of a semiconductor device according to example embodiments of the present inventive concepts.

FIGS. 4 and 5 are perspective views showing parts of a semiconductor device according to example embodiments of the present inventive concepts, and FIG. 6 is a layout showing a part of the semiconductor device. FIG. 5 is a perspective view showing a partial configuration of FIG. 4, FIG. 6 is a layout showing some components of FIG. 4 disposed on a substrate 21, and FIG. 1 may correspond to a part of a cross-sectional view taken along line I-I' of FIGS. 4 and 6.

Referring to FIG. 4, the semiconductor device may include a pad isolation layer 50, a plurality of conductive pads 51 and 52, insulating patterns 61, seed layers 63, a plurality of lower electrodes 71 and 72, a capacitor dielectric layer 81, and an upper electrode 91.

Referring to FIG. 5, the semiconductor device may include the pad isolation layer 50, the plurality of conductive pads 51 and 52, the insulating patterns 61, the seed layers 63, and the plurality of lower electrodes 71 and 72. Each of the plurality of lower electrodes 71 and 72 may include a lower region LP having a horizontal width greater than a height thereof and an upper region UP having a height greater than a horizontal width thereof. The upper region UP may include a monocrystalline perovskite lower conductive layer SLC. The lower region LP may include a polycrystalline perovskite lower conductive layer PLC and the monocrystalline perovskite lower conductive layer SLC. Each of the insulating patterns 61 may include a first side surface S1 and a second side surface S2 opposite to the first side surface S1. The first side surface S1 may be adjacent to a first conductive pad 51, and the second side surface S2 may be adjacent to a second conductive pad 52. The seed layers 63 may be formed next to the side surfaces S1 and S2 of the insulating patterns 61. The plurality of lower electrodes 71 and 72 may be formed on the outer sides of the seed layers 63. The first lower electrodes 71 may be adjacent to the first side surfaces S1 and may be in contact with the seed layers 63 and the first conductive pads 51. The second lower electrodes 72 may be adjacent to the second side surfaces S2 and may be in contact with the seed layers 63 and the second conductive pads 52.

Referring to FIG. 6, the insulating patterns 61, the seed layers 63, and the plurality of lower electrodes 71 and 72 may be disposed on the substrate 21. The insulating patterns 61 may be repeatedly arranged in a row direction and a column direction.

Referring back to FIGS. 5 and 6, one pair of lower electrodes 71 and 72 may be aligned on one pair of conductive pads 51 and 52. In an example embodiment, the pair of conductive pads 51 and 52 may be repeatedly disposed on the substrate 21 in the row direction and the column direction. The pair of lower electrodes 71 and 72 may be repeatedly disposed on the substrate 21 in the row direction and the column direction along with the repeated arrangement of the pair of conductive pads 51 and 52. The repeated arrangement of the pair of conductive pads 51 and 52 may be separated from each other by the pad isolation layer 50.

Figure 7:
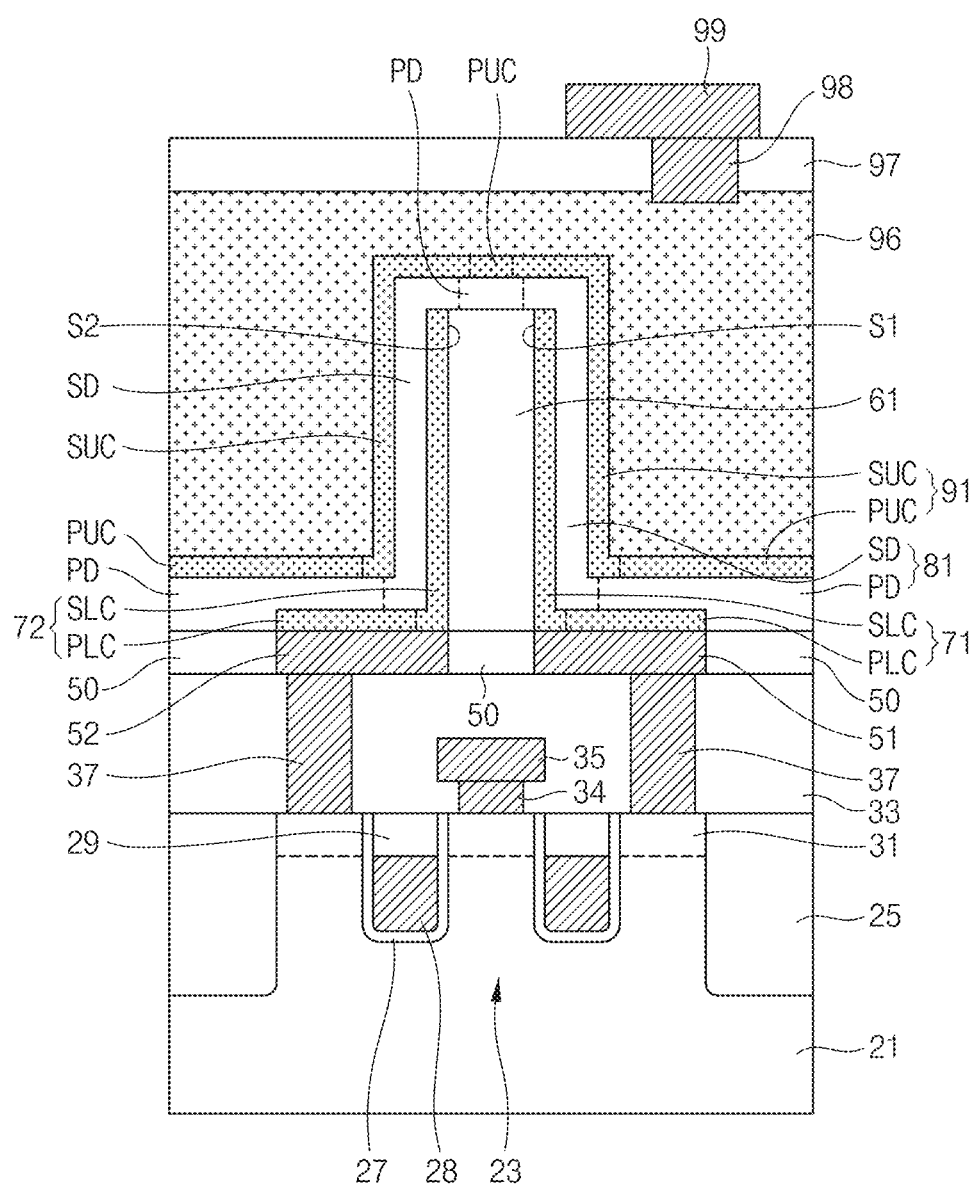
FIG. 7 is a cross-sectional view illustrating a semiconductor device according to an example embodiment of the present inventive concepts.

FIG. 7 is a cross-sectional view illustrating a semiconductor device according to an example embodiment of the present inventive concepts.

Referring to FIG. 7, the semiconductor device may include a substrate 21, a pad isolation layer 50, a plurality of conductive pads 51 and 52, an insulating pattern 61, a plurality of lower electrodes 71 and 72, a capacitor dielectric layer 81, and an upper electrode 91.

The insulating pattern 61 may include a first side surface S1 and a second side surface S2 opposite to the first side surface S1. The first lower electrode 71 may come in direct contact with the first side surface S1 and the first conductive pad 51. The second lower electrode 72 may come in direct contact with the second side surface S2 and the second conductive pad 52. Monocrystalline perovskite lower conductive layers SLC may be formed relatively close to the side surfaces S1 and S2 of the insulating pattern 61, compared to polycrystalline perovskite lower conductive layers PLC. The monocrystalline perovskite lower conductive layers SLC may come in direct contact with the first side surface S1 and the second side surface S2.

The capacitor dielectric layer 81 may cover the plurality of lower electrodes 71 and 72, and cover an upper surface of the insulating pattern 61 and the pad isolation layer 50. Monocrystalline perovskite dielectric layers SD may be formed relatively close to the side surfaces S1 and S2 of the insulating pattern 61, compared to polycrystalline perovskite dielectric layers PD. The monocrystalline perovskite dielectric layers SD may be formed relatively close to the monocrystalline perovskite lower conductive layers SLC, compared to the polycrystalline perovskite dielectric layers PD.

Due to the configuration of the insulating pattern 61, the plurality of lower electrodes 71 and 72, the capacitor dielectric layer 81, and the upper electrode 91, capacitors having increased capacitance may be implemented to have reduced leakage current. In an example embodiment, the semiconductor device described with reference to FIG. 7 may be the same as or substantially similar to the semiconductor device of FIG. 1, except for an omission of the seed layers 63.

Figure 8:
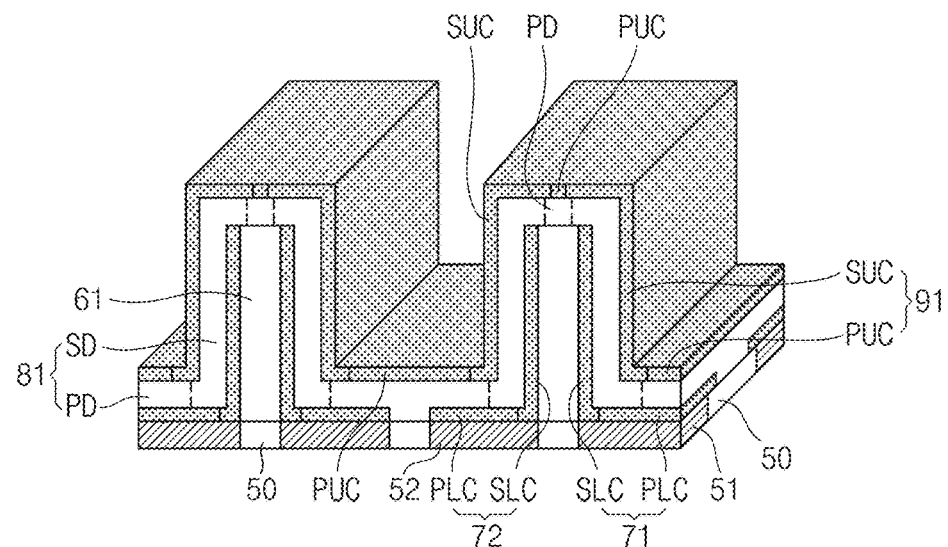
FIGS. 8 and 9 are perspective views showing parts of a semiconductor device according to example embodiments of the present inventive concepts.
Figure 9:
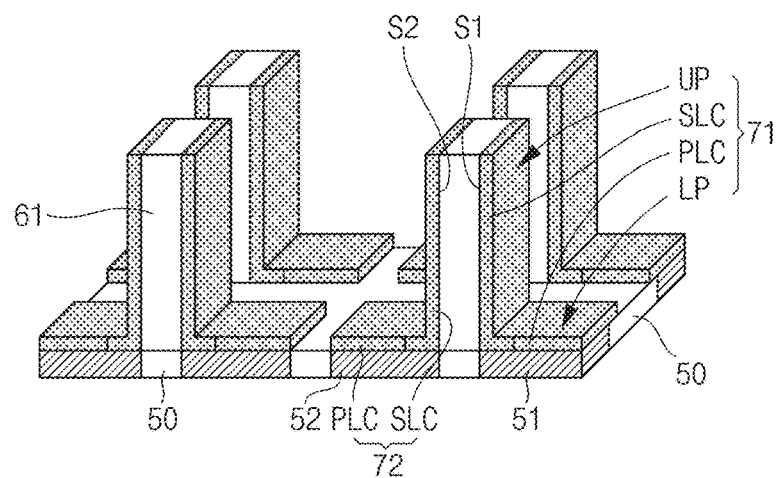
Figure 10:
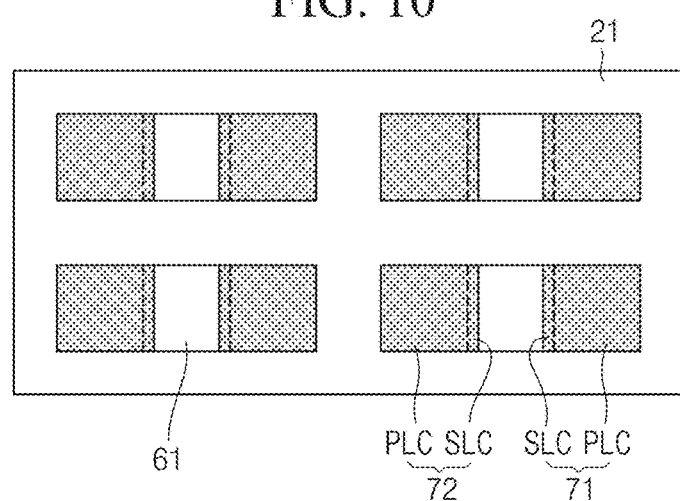
FIG. 10 is a layout showing a part of a semiconductor device according to example embodiments of the present inventive concepts.

FIGS. 8 and 9 are perspective views showing parts of a semiconductor device according to example embodiments of the present inventive concepts, and FIG. 10 is a layout showing a part of the semiconductor device. FIG. 9 is a perspective view showing a partial configuration of FIG. 8, FIG. 10 is a layout showing some components of FIG. 8 disposed on a substrate 21, and FIG. 7 may correspond to a cross-sectional view of a part of FIGS. 8 and 10.

Referring to FIG. 8, monocrystalline perovskite lower conductive layers SLC may come in direct contact with insulating patterns 61.

Referring to FIG. 9, the monocrystalline perovskite lower conductive layers SLC may come in direct contact with first and second side surfaces S1 and S2 of the insulating patterns 61.

Referring to FIG. 10, the insulating patterns 61 and the plurality of lower electrodes 71 and 72 may be disposed on the substrate 21.

FIGS. 11, 13, 15, 17, 19, 21, 23, 25, 26, 27, 29, 31, 33, 35, 37, 39, and 41 are cross-sectional views taken along lines I-I', and of FIGS. 4 and 6 to illustrate a method of fabricating a semiconductor device according to example embodiments of the present inventive concepts. FIGS. 12, 14, 16, 18, 20, 22, 24, 28, 30, 32, 34, 36, 38, and 40 are perspective views of the semiconductor device according to the process operations of FIGS. 11, 13, 15, 17, 19, 21, 23, 25, 26, 27, 29, 31, 33, 35, 37, 39, and 41, and FIGS. 42 and 43 are partial diagrams showing parts of FIG. 41.

Figure 11:
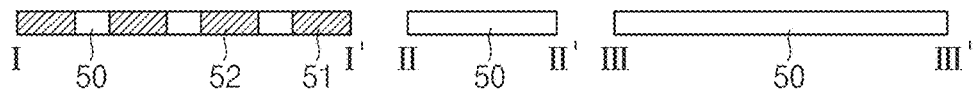
FIGS. 11, 13, 15, 17, 19, 21, 23, 25, 26, 27, 29, 31, 33, 35, 37, 39, and 41 are cross-sectional views illustrating a method of fabricating a semiconductor device according to example embodiments of the present inventive concepts.
Figure 12:
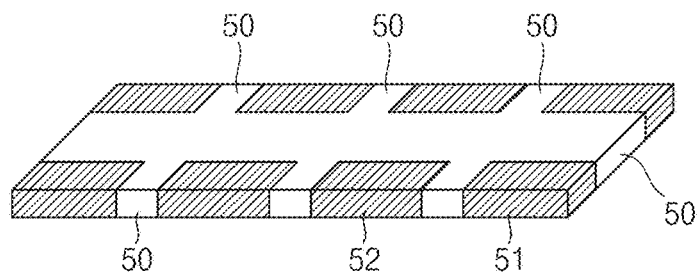
FIGS. 12, 14, 16, 18, 20, 22, 24, 28, 30, 32, 34, 36, 38, and 40 are perspective views illustrating a method of fabricating a semiconductor device according to the process operations of FIGS. 11, 13, 15, 17, 19, 21, 23, 25, 26, 27, 29, 31, 33, 35, 37, 39, and 41.

Referring to FIGS. 11 and 12, the pad isolation layer 50 and the plurality of conductive pads 51 and 52 may be formed. The plurality of conductive pads 51 and 52 may include the first conductive pads 51 and the second conductive pads 52.

The pad isolation layer 50 may include an insulating material, for example, silicon oxide, silicon nitride, silicon oxynitride, silicon oxycarbonitride (SiOCN), or a combination thereof. The pad isolation layer 50 may include a single-layer or multi-layer structure, and include a single-pattern structure or a structure in which a plurality of insulating patterns are combined. In an example embodiment, the pad isolation layer 50 may include silicon nitride.

The plurality of conductive pads 51 and 52 may include conductive patterns formed of for example, metal, a metal nitride, metal oxide, a metal silicide, polysilicon, conductive carbon, or a combination thereof. Formation of the pad isolation layer 50 and the plurality of conductive pads 51 and 52 may involve a thin film formation process, a patterning process, and a planarization process. The planarization process may include a chemical mechanical polishing (CMP) process, an etch-back process, or a combination thereof. Upper surfaces of the pad isolation layer 50 and the plurality of conductive pads 51 and 52 may be substantially coplanar. Each of the plurality of conductive pads 51 and 52 may be surrounded by the pad isolation layer 50. The plurality of conductive pads 51 and 52 may be regularly arranged in a two-dimensional array of the row direction and the column direction.

In an example embodiment, the pad isolation layer 50 may include a plurality of insulating patterns. The pad isolation layer 50 may be interposed among the plurality of conductive pads 51 and 52.

In an example embodiment, the pad isolation layer 50 and the plurality of conductive pads 51 and 52 may be formed on a substrate 21 which is the same as or substantially similar to that described above with reference to FIG. 1. Each of the plurality of conductive pads 51 and 52 may pass through the pad isolation layer 50 and may be connected to a switching element which is the same as or substantially similar to that described above with reference to FIG. 1.

Figure 13:
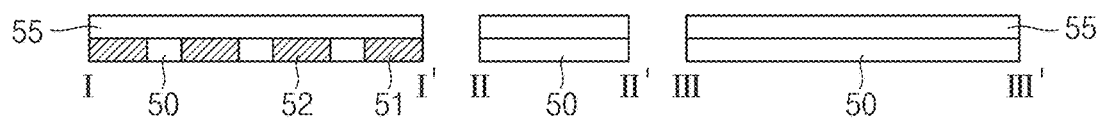
Figure 14:
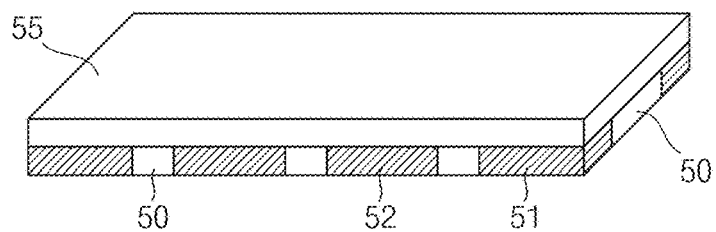

Referring to FIGS. 13 and 14, a sacrificial seed layer 55 may be formed on the pad isolation layer 50 and the plurality of conductive pads 51 and 52. The sacrificial seed layer 55 may include Ni, Cu, Al, Pd, or a combination thereof.

Figure 15:
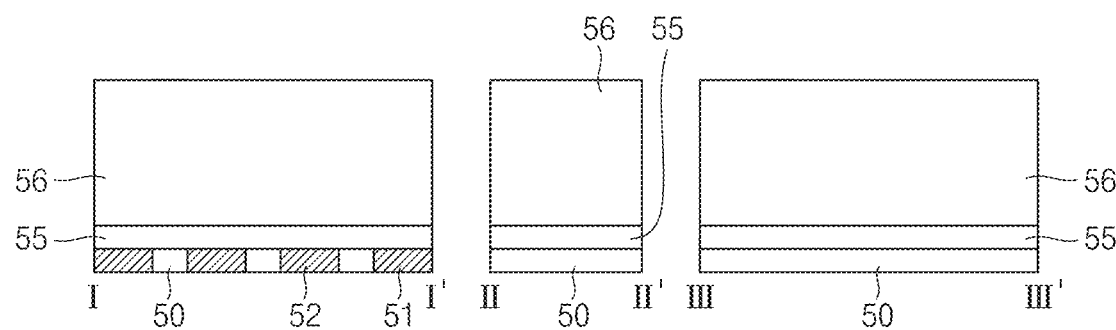
Figure 16:
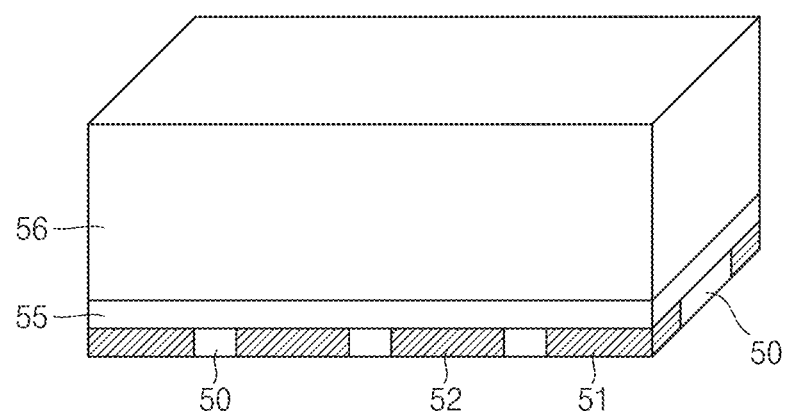

Referring to FIGS. 15 and 16, a sacrificial layer 56 may be formed on the sacrificial seed layer 55. The sacrificial layer 56 may include a monocrystalline Ge layer, a monocrystalline S1 layer, a monocrystalline SiC layer, a monocrystalline SiGe layer, or a combination thereof. For example, the sacrificial layer 56 may include a monocrystalline Ge layer. The sacrificial layer 56 may have a greater thickness than that of the sacrificial seed layer 55. In an example embodiment, formation of the sacrificial layer 56 may include a process of forming a Ge layer on the sacrificial seed layer 55 and a process of crystallizing the Ge layer by applying laser annealing thereto. In an example embodiment, the sacrificial layer 56 may be formed by using an epitaxial growth technique.

In an example embodiment, the sacrificial seed layer 55 may be formed on the sacrificial layer 56. In an example embodiment, the sacrificial seed layer 55 may be formed on and under the sacrificial layer 56. In an example embodiment, the sacrificial seed layer 55 and the sacrificial layer 56 may be stacked alternately and repeatedly.

Figure 17:
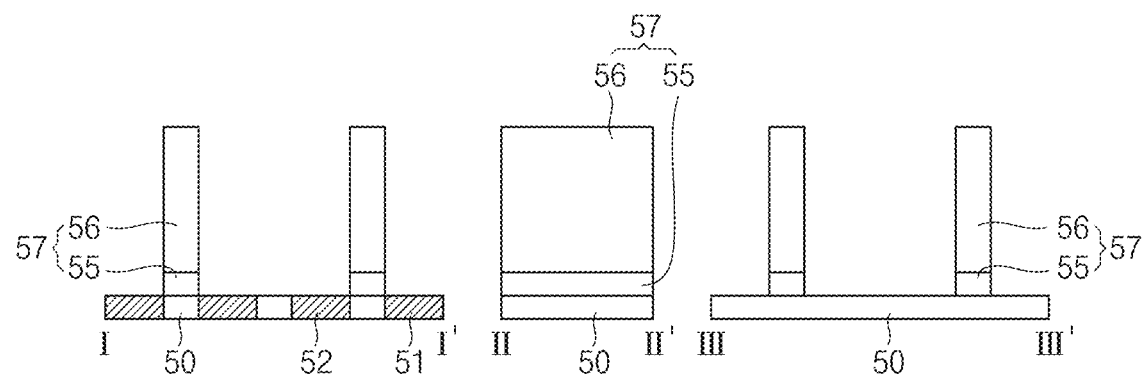
Figure 18:
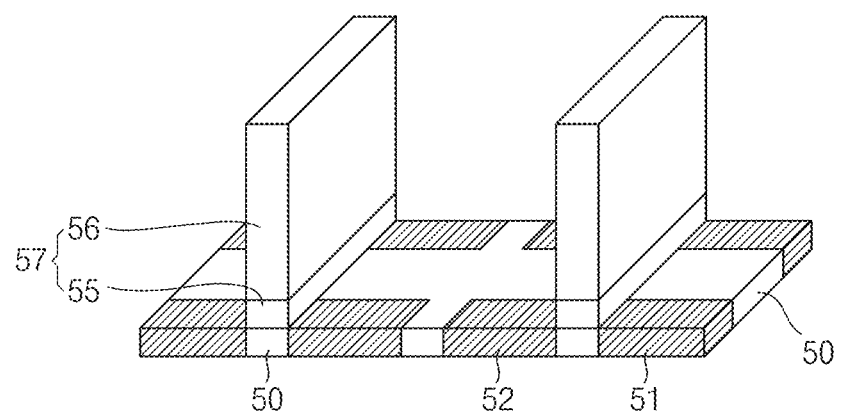

Referring to FIGS. 17 and 18, sacrificial patterns 57 may be formed by patterning the sacrificial layer 56 and the sacrificial seed layer 55. The respective sacrificial patterns 57 may be formed on the pad isolation layer 50 between the plurality of conductive pads 51 and 52. Each of the sacrificial patterns 57 may have a height greater than a horizontal width thereof. Upper surfaces of the plurality of conductive pads 51 and 52 may be exposed. The upper surface of the pad isolation layer 50 may be at least partially covered by the sacrificial patterns 57.

In an example embodiment, the sacrificial patterns 57 may be disposed on the pad isolation layer 50 in parallel with each other in the row direction. The sacrificial patterns 57 and pairs of conductive pads 51 and 52 may be alternately disposed.

Figure 19:
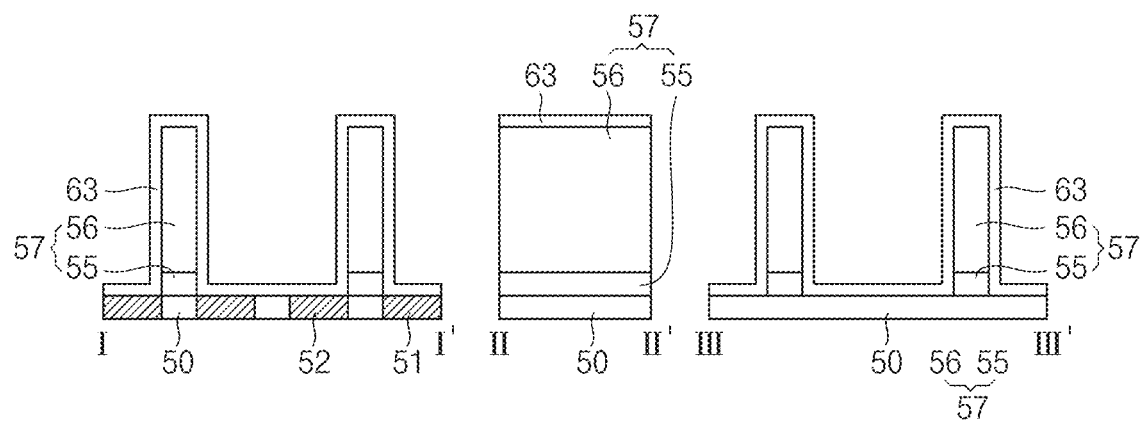
Figure 20:
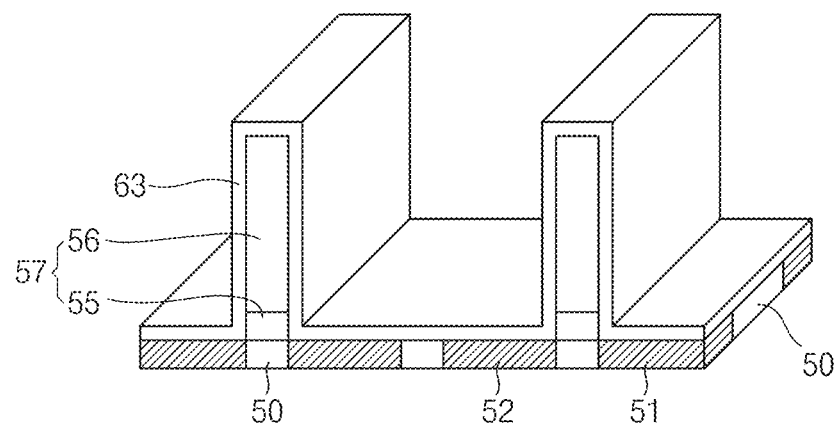

Referring to FIGS. 19 and 20, the seed layers 63 may be formed to cover side surfaces and upper surfaces of the sacrificial patterns 57 and cover the plurality of conductive pads 51 and 52 and the pad isolation layer 50. The seed layers 63 may include a monocrystalline material. For example, the seed layers 63 may include a monocrystalline perovskite material. In an example embodiment, the seed layers 63 may include a monocrystalline perovskite dielectric material, a monocrystalline perovskite conductive material, or a combination thereof. The monocrystalline perovskite dielectric material may include $SrTiO_3$, $BaTiO_3$, $(Ba, Sr)TiO_3$, $CaTiO_3$, $PbTiO_3$, $KTaO_3$, $NaNbO_3$, $HfPbO_3$, $KNbO_3$, $BaTiO_3$, or a combination thereof. The monocrystalline perovskite conductive material may include $SrRuO_3$, $BaSnO_3$, $(La, Sr)CoO_3$, $(La, Sr)CuO_3$, $(La, Sr)MnO_3$, $LaNiO_3$, $SrSnO_3$, $SrMoO_3$, or a combination thereof. For example, the seed layers 63 may include $SrTiO_3$ layers.

In an example embodiment, formation of the seed layers 63 may include a process of depositing a thin film and a process of crystallizing the thin film by applying laser annealing thereto. In an example embodiment, the seed layers 63 may be formed by using an epitaxial growth technique.

Figure 21:
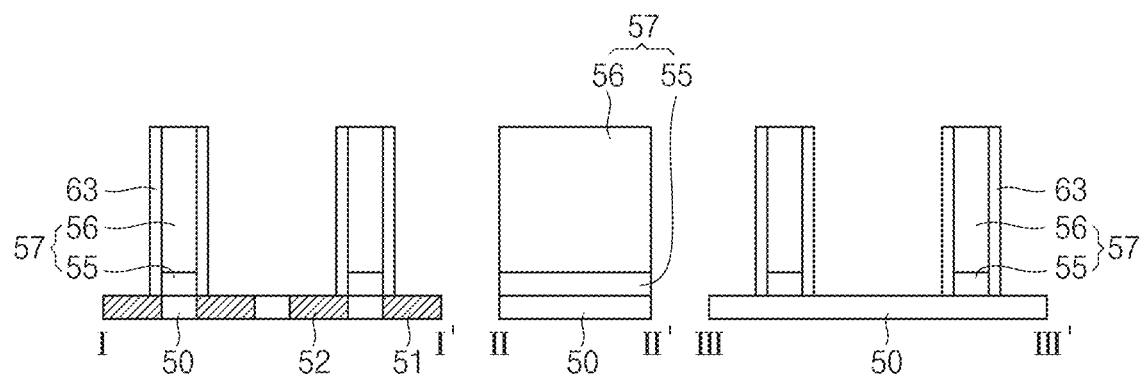
Figure 22:
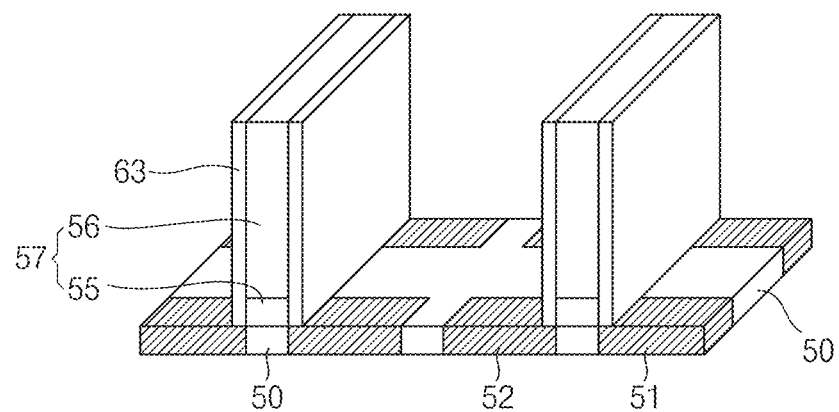

Referring to FIGS. 21 and 22, the plurality of conductive pads 51 and 52 may be exposed by partially removing the seed layers 63. Due to the process of exposing the plurality of conductive pads 51 and 52, some of the pad isolation layers 50 and the upper surfaces of the sacrificial patterns 57 may also be exposed. The seed layers 63 may be retained next to the side surfaces of the sacrificial patterns 57. The seed layers 63 may be partially removed by using an anisotropic etching process. In an example embodiment, due to the etching process, the seed layers 63 may remain only on both sidewalls of the sacrificial patterns 57 in the row direction.

Figure 23:
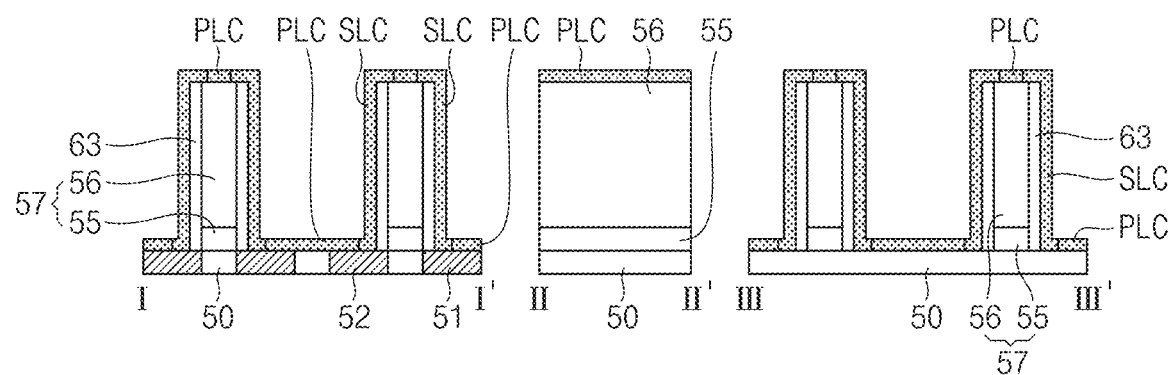
Figure 24:
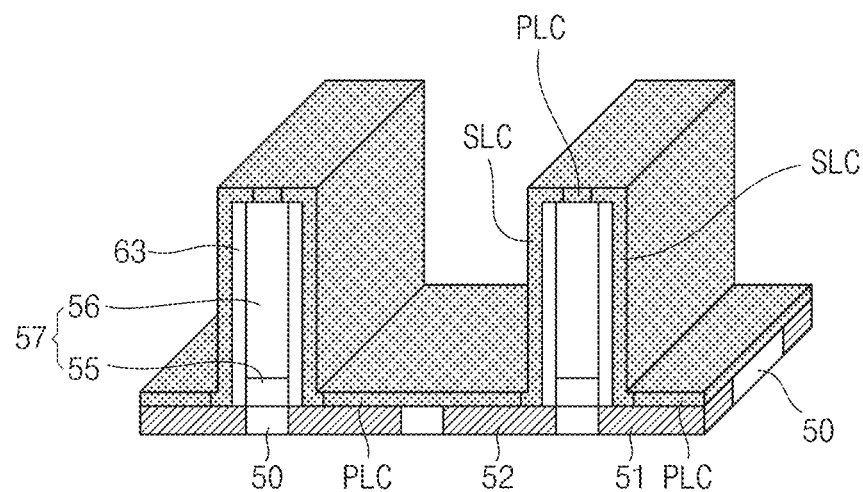

Referring to FIGS. 23 and 24, the monocrystalline perovskite lower conductive layers SLC and the polycrystalline perovskite lower conductive layers PLC may be formed to cover outer sides of the seed layers 63, the plurality of conductive pads 51 and 52, the upper surfaces of the sacrificial patterns 57, and the pad isolation layer 50. The monocrystalline perovskite lower conductive layers SLC may be formed relatively close to the seed layers 63, compared to the polycrystalline perovskite lower conductive layers PLC. The polycrystalline perovskite lower conductive layers PLC may be in continuity with or may be connected to the monocrystalline perovskite lower conductive layers SLC. The monocrystalline perovskite lower conductive layers SLC and the polycrystalline perovskite lower conductive layers PLC may include SrRuO3, BaSnO3, (La, Sr)CoO3, (La, Sr)CuO3, (La, Sr)MnO3, LaNiO3, SrSnO3, SrMoO3, or a combination thereof. For example, the monocrystalline perovskite lower conductive layers SLC and the polycrystalline perovskite lower conductive layers PLC may include SrRuO3 layers.

In an example embodiment, formation of the monocrystalline perovskite lower conductive layers SLC and the polycrystalline perovskite lower conductive layers PLC may include a process of depositing a thin film and a process of crystallizing the thin film by applying laser annealing thereto. In an example embodiment, the monocrystalline perovskite lower conductive layers SLC and the polycrystalline perovskite lower conductive layer PLC may be formed by using an epitaxial growth technique.

In an example embodiment, during the process of forming the monocrystalline perovskite lower conductive layers SLC and the polycrystalline perovskite lower conductive layers PLC, the seed layers 63 may serve to induce crystallization of the monocrystalline perovskite lower conductive layers SLC. The monocrystalline perovskite lower conductive layers SLC may grow in crystal directions of the seed layers 63 and also in a lateral direction to the crystal directions. The monocrystalline perovskite lower conductive layers SLC may slightly extend outward from the seed layers 63. The monocrystalline perovskite lower conductive layers SLC may have a greater width than the seed layers 63. Boundaries between the monocrystalline perovskite lower conductive layers SLC and the polycrystalline perovskite lower conductive layers PLC may be formed on the plurality of conductive pads 51 and 52. Lower ends of the monocrystalline perovskite lower conductive layers SLC and lower surfaces of the polycrystalline perovskite lower conductive layers PLC may come in direct contact with upper surfaces of the plurality of conductive pads 51 and 52.

Figure 25:
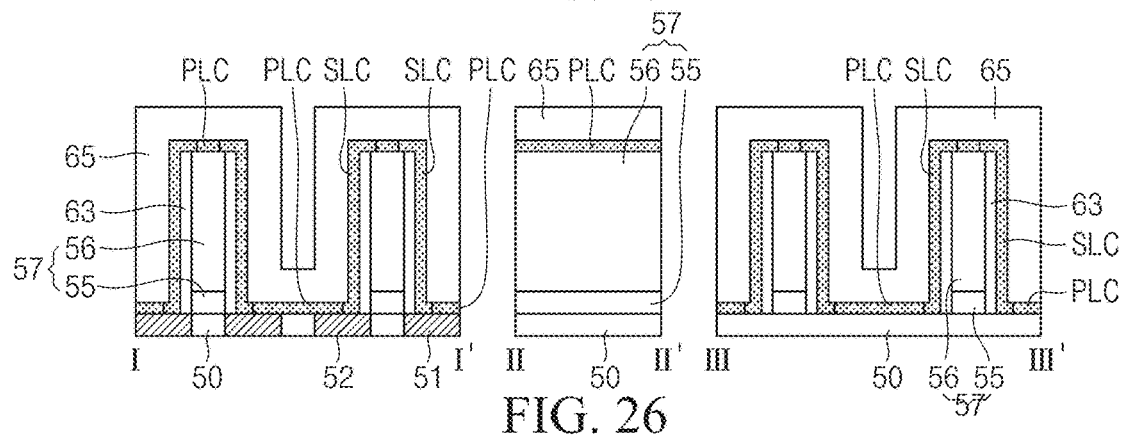

Referring to FIG. 25, a spacer layer 65 may be formed to conformally cover upper surfaces of the monocrystalline perovskite lower conductive layers SLC and the polycrystalline perovskite lower conductive layers PLC. The spacer layer 65 may include polysilicon.

Figure 26:
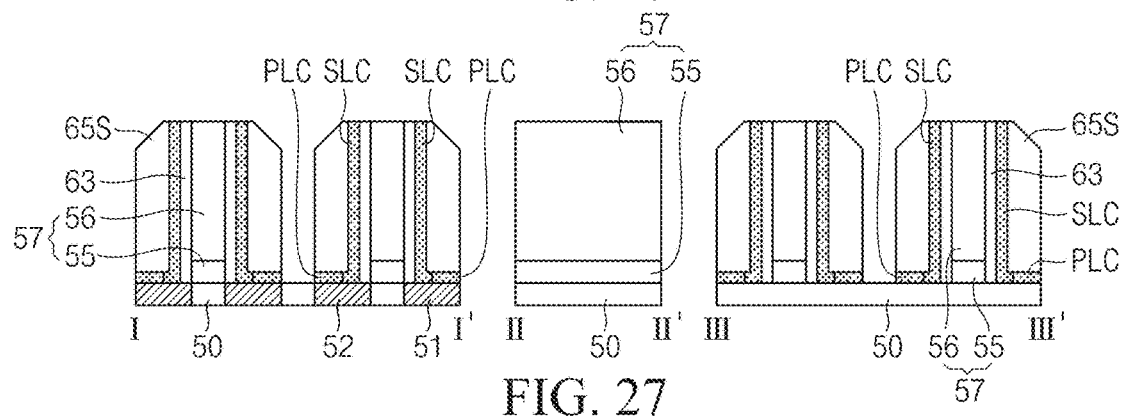

Referring to FIG. 26, the spacer layer 65, the monocrystalline perovskite lower conductive layers SLC, and the polycrystalline perovskite lower conductive layers PLC may be anisotropically etched such that spacers 65S may be formed. The spacers 65S may be retained on the side surfaces of the sacrificial patterns 57 and the upper surfaces of the plurality of conductive pads 51 and 52. The upper surfaces of the sacrificial patterns 57, upper surfaces of the seed layers 63, and upper ends of the monocrystalline perovskite lower conductive layers SLC may be exposed. The pad isolation layers 50 between the spacers 65S may be exposed. The monocrystalline perovskite lower conductive layers SLC may be retained between the spacers 65S and the seed layers 63. The polycrystalline perovskite lower conductive layers PLC may be retained between the spacers 65S and the plurality of conductive pads 51 and 52.

Figure 27:
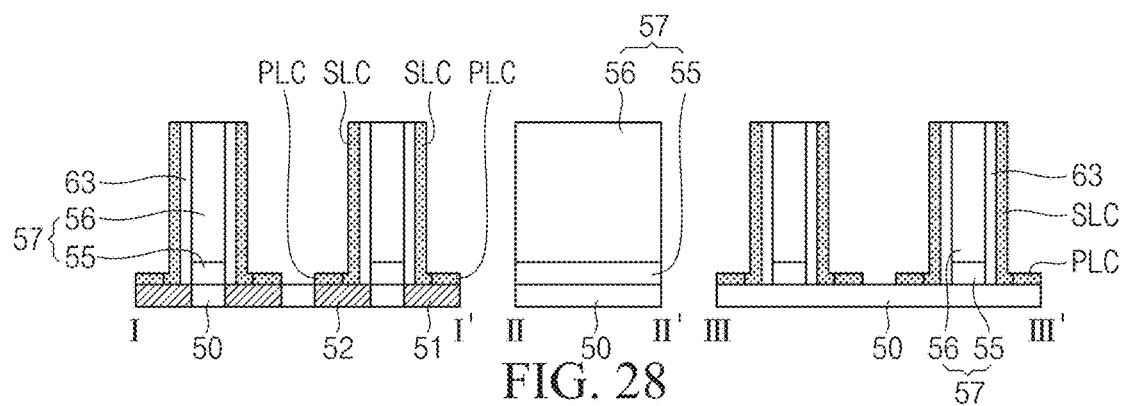
Figure 28:
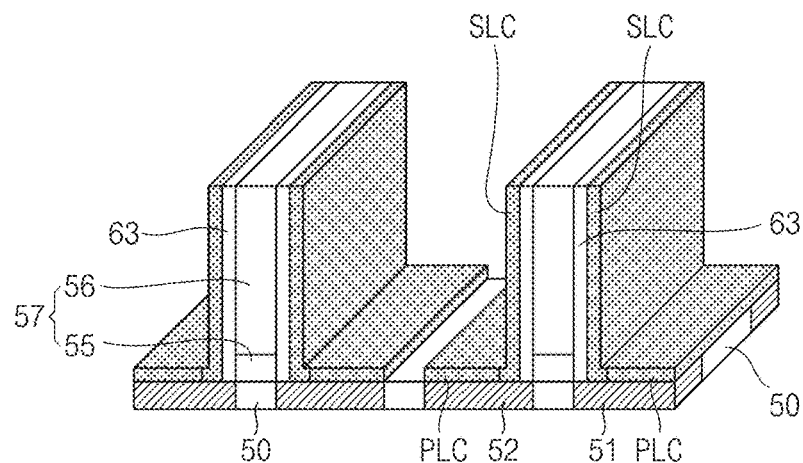

Referring to FIGS. 27 and 28, the spacers 65S may be completely removed such that the monocrystalline perovskite lower conductive layers SLC and the polycrystalline perovskite lower conductive layers PLC may be exposed.

Figure 29:
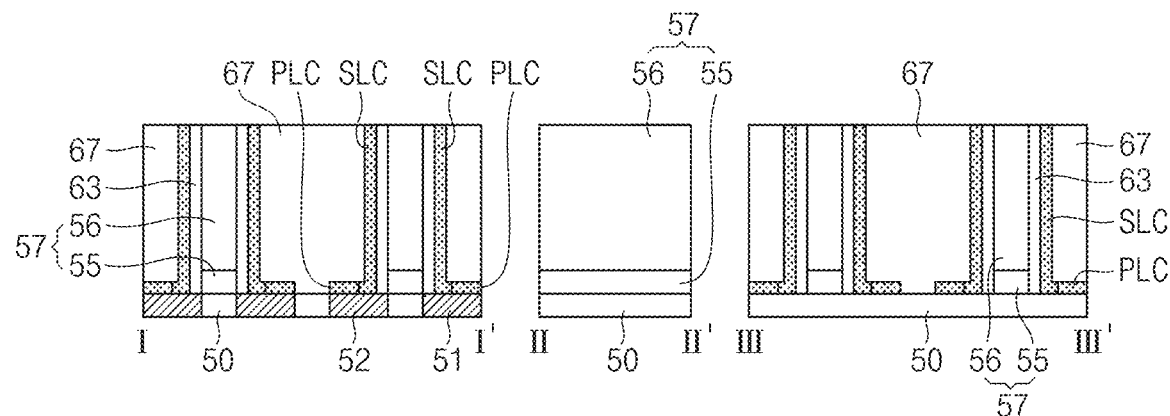
Figure 30:
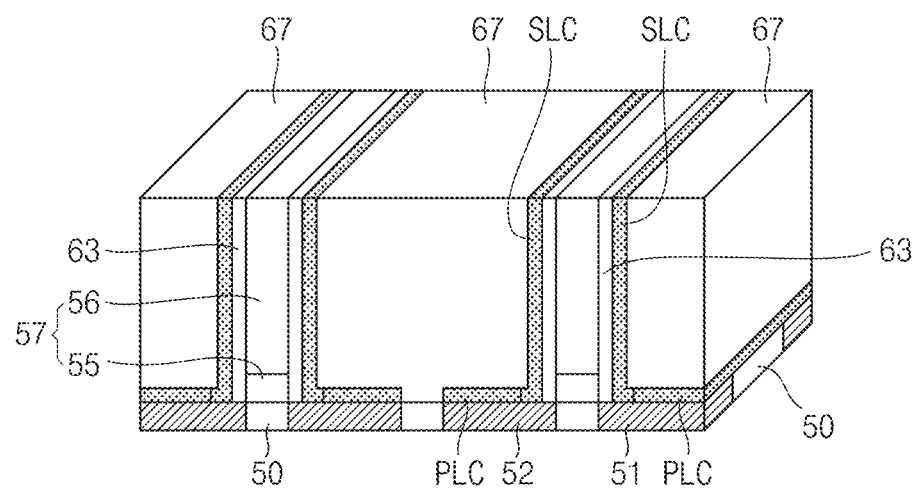

Referring to FIGS. 29 and 30, a mold layer 67 may be formed to fill gaps between the sacrificial patterns 57. A thin film formation process and a planarization process may be used to form the mold layer 67. The planarization process may include a CMP process, an etch-back process, or a combination thereof. The upper surfaces of the sacrificial patterns 57, the upper surfaces of the seed layers 63, the upper ends of the monocrystalline perovskite lower conductive layers SLC, and an upper surface of the mold layer 67 may be exposed. The mold layer 67 may include a polysilicon.

Figure 31:
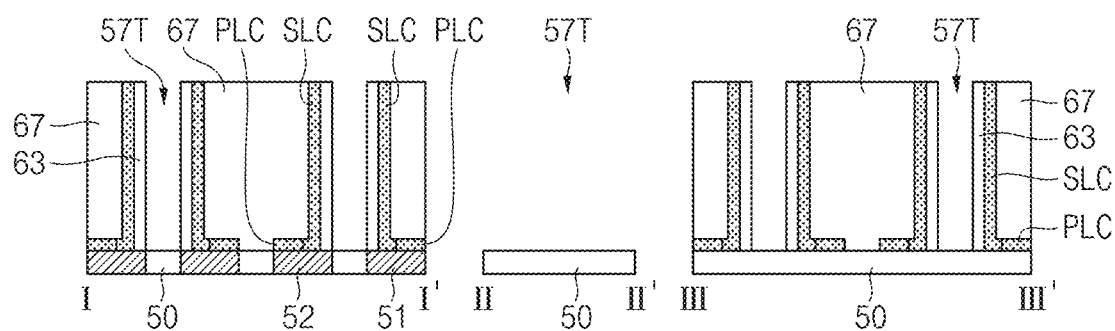
Figure 32:
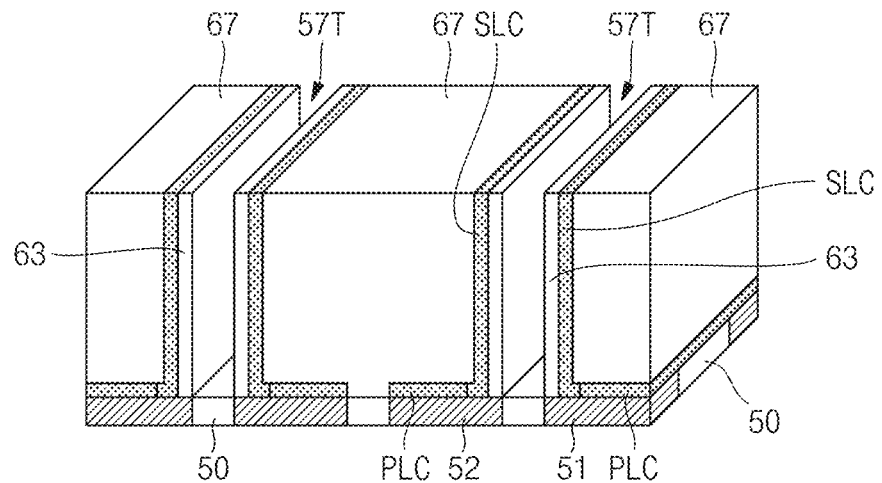

Referring to FIGS. 31 and 32, the sacrificial patterns 57 may be completely removed such that trenches 57T may be formed. The pad isolation layer 50 may be exposed on bottoms of the trenches 57T. The seed layers 63 may be exposed on sidewalls of the trenches 57T.

Figure 33:
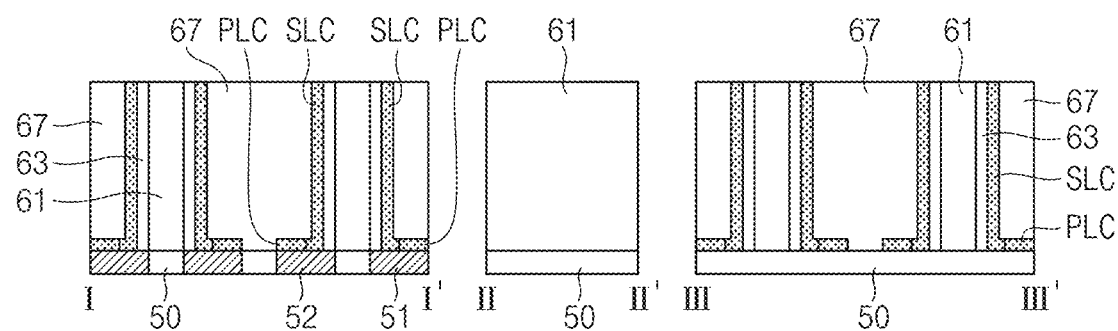
Figure 34:
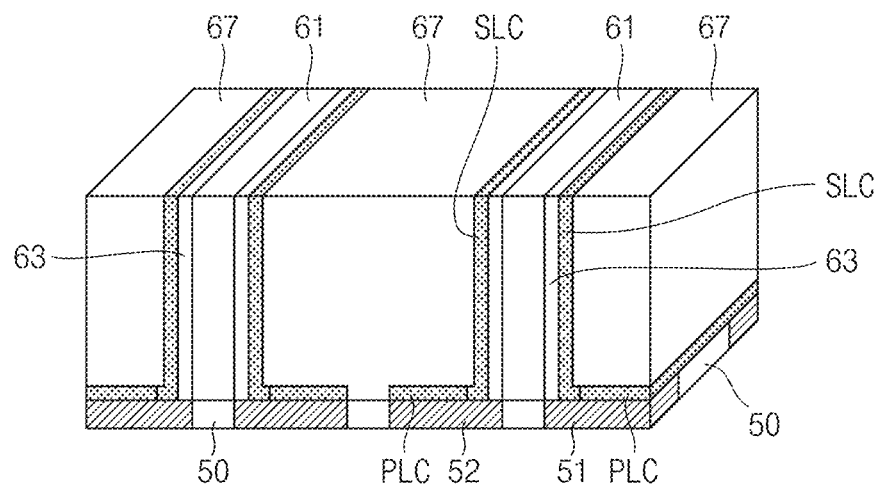

Referring to FIGS. 33 and 34, the insulating patterns 61 may be formed in the trenches 57T. A thin film formation process and a planarization process may be used to form the insulating patterns 61. The planarization process may include a CMP process, an etch-back process, or a combination thereof. Upper surfaces of the insulating patterns 61, the upper surfaces of the seed layers 63, the upper ends of the monocrystalline perovskite lower conductive layers SLC, and the upper surface of the mold layer 67 may be exposed. The insulating patterns 61 may include a silicon oxide, a silicon nitride, a silicon oxynitride, a silicon oxycarbonitride, a low-K dielectric, or a combination thereof. In an example embodiment, the insulating patterns 61 may be a silicon oxide.

Each of the insulating patterns 61 may have a single-layer structure. Each of the insulating patterns 61 may have a physically continuous integrated structure including a plurality of layers. Each of the insulating patterns 61 may come in direct contact with the pad isolation layer 50.

Figure 35:
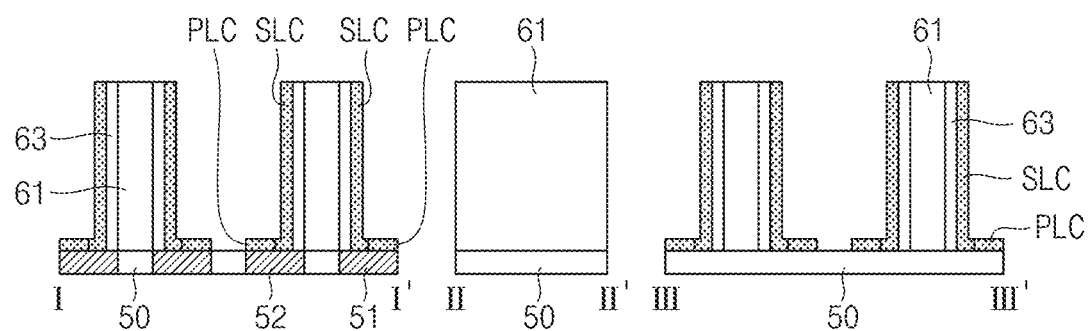
Figure 36:
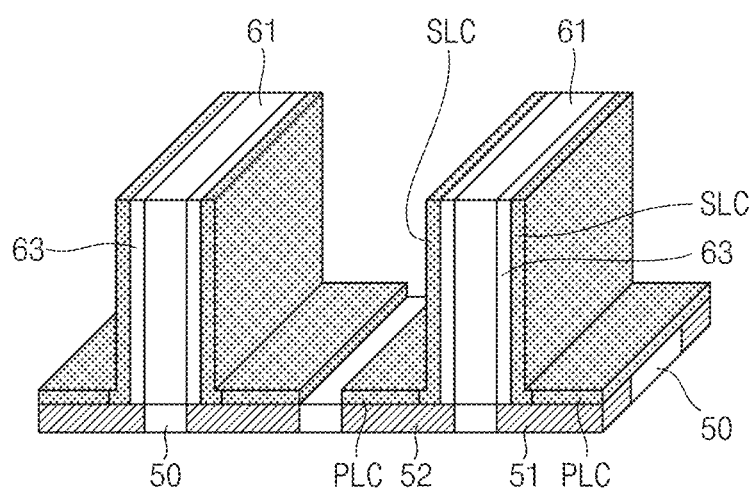

Referring to FIGS. 35 and 36, the mold layer 67 may be completely removed such that the monocrystalline perovskite lower conductive layers SLC and the polycrystalline perovskite lower conductive layers PLC may be exposed.

Figure 37:
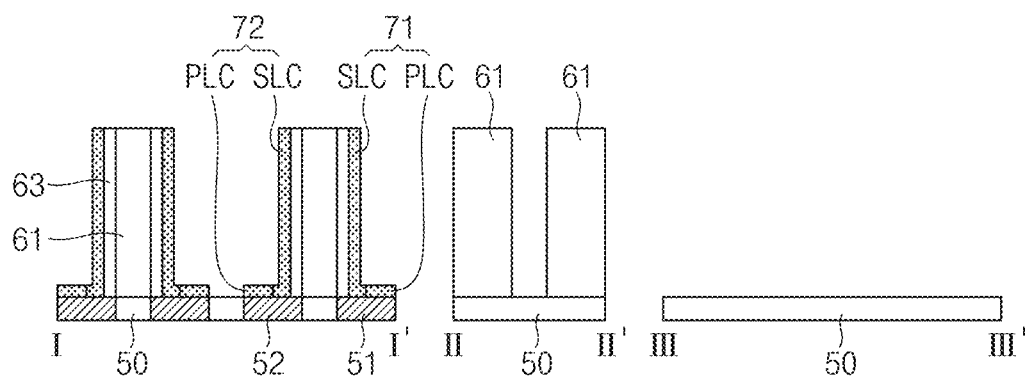
Figure 38:
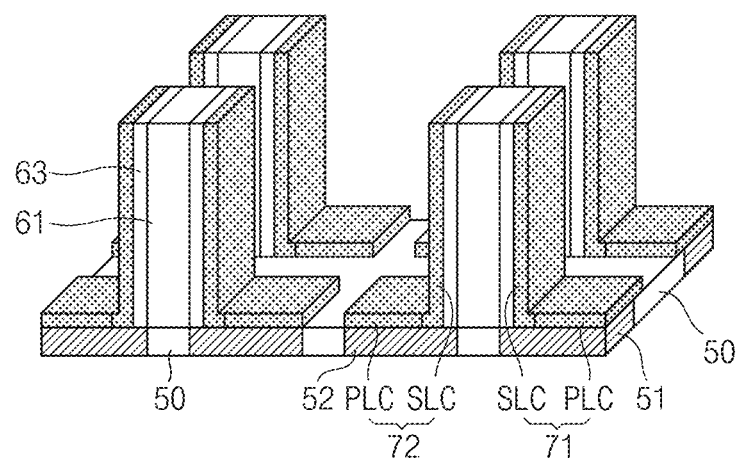

Referring to FIGS. 37 and 38, a node separation process may be used to form the plurality of lower electrodes 71 and 72. The plurality of lower electrodes 71 and 72 may include the first lower electrodes 71 and the second lower electrodes 72. The respective insulating patterns 61 may be retained between the plurality of lower electrodes 71 and 72. The seed layers 63 may be retained between the plurality of lower electrodes 71 and 72 and the insulating patterns 61. Each of the plurality of lower electrodes 71 and 72 may include a monocrystalline perovskite lower conductive layer SLC and a polycrystalline perovskite lower conductive layer PLC which is in continuity with or is connected to the monocrystalline perovskite lower conductive layer SLC.

Figure 39:
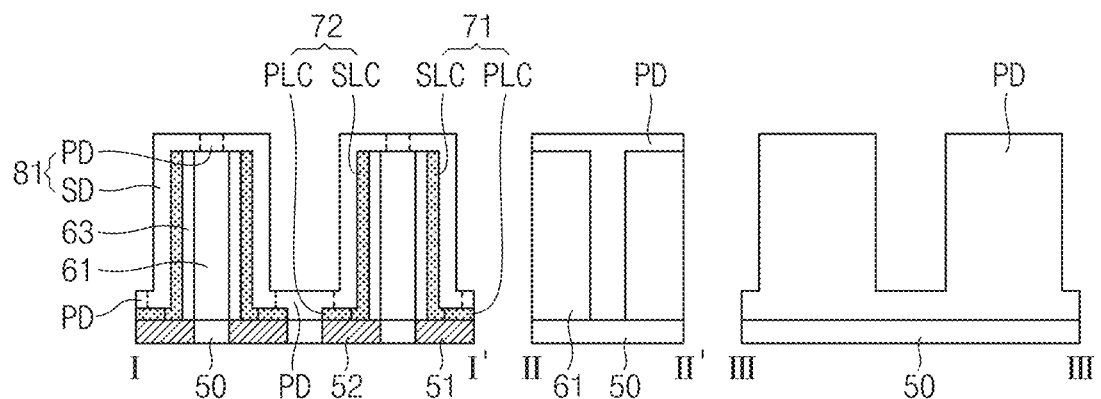
Figure 40:
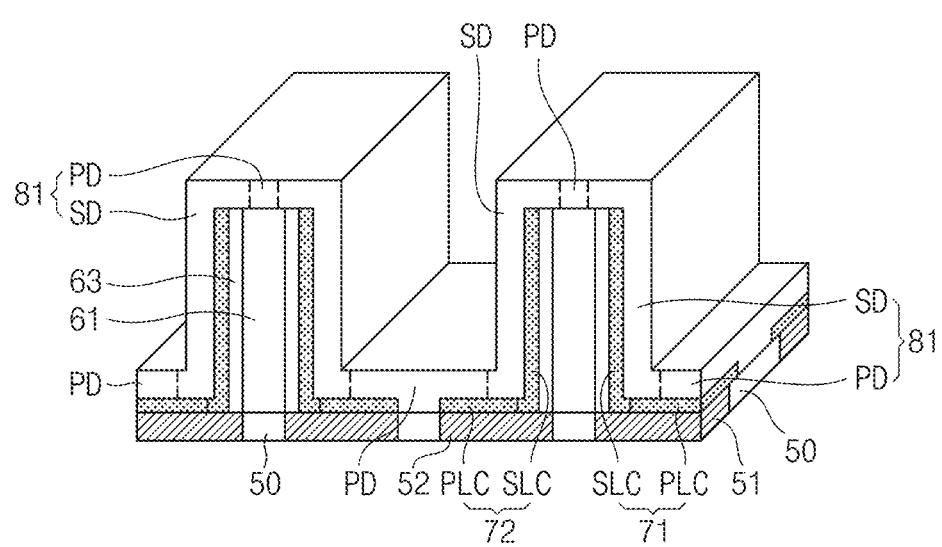

Referring to FIGS. 39 and 40, the capacitor dielectric layer 81 may be formed to cover upper surfaces of the plurality of lower electrodes 71 and 72, the seed layers 63, the insulating patterns 61, and the pad isolation layer 50. The capacitor dielectric layer 81 may include a monocrystalline perovskite dielectric layer SD and a polycrystalline perovskite dielectric layer PD.

The monocrystalline perovskite dielectric layers SD and the polycrystalline perovskite dielectric layer PD may include SrTiO3, BaTiO3, (Ba, Sr)TiO3, CaTiO3, PbTiO3, KTaO3, NaNbO3, HfPbO3, KNbO3, BaTiO3, or a combination thereof. In an example embodiment, the monocrystalline perovskite dielectric layers SD and the polycrystalline perovskite dielectric layer PD may include superlattice structures formed by alternately depositing at least two materials selected from among SrTiO3, BaTiO3, (Ba, Sr)TiO3, CaTiO3, PbTiO3, KTaO3, NaNbO3, HfPbO3, KNbO3, and BaTiO3. For example, the monocrystalline perovskite dielectric layers SD and the polycrystalline perovskite dielectric layer PD may include superlattice structures formed by alternately depositing BaTiO3 and SrTiO3.

In an example embodiment, formation of the capacitor dielectric layer 81 may include a process of depositing a thin film and a process of crystallizing the thin film by applying laser annealing thereto. In an example embodiment, the capacitor dielectric layer 81 may be formed by using an epitaxial growth technique.

In an example embodiment, during the process of forming the capacitor dielectric layer 81, the monocrystalline perovskite lower conductive layers SLC may serve to induce crystallization of the monocrystalline perovskite dielectric layers SD. The monocrystalline perovskite dielectric layers SD may grow in crystal directions of the monocrystalline perovskite lower conductive layers SLC and also in a lateral direction to the crystal directions. The monocrystalline perovskite dielectric layers SD may slightly extend outward from the monocrystalline perovskite lower conductive layers SLC. The monocrystalline perovskite dielectric layers SD may have a greater width than the monocrystalline perovskite lower conductive layers SLC. The monocrystalline perovskite dielectric layers SD may have a greater width than the seed layers 63. Boundaries between the monocrystalline perovskite dielectric layers SD and the polycrystalline perovskite dielectric layer PD may be formed on the outside of the monocrystalline perovskite lower conductive layers SLC.

Figure 41:
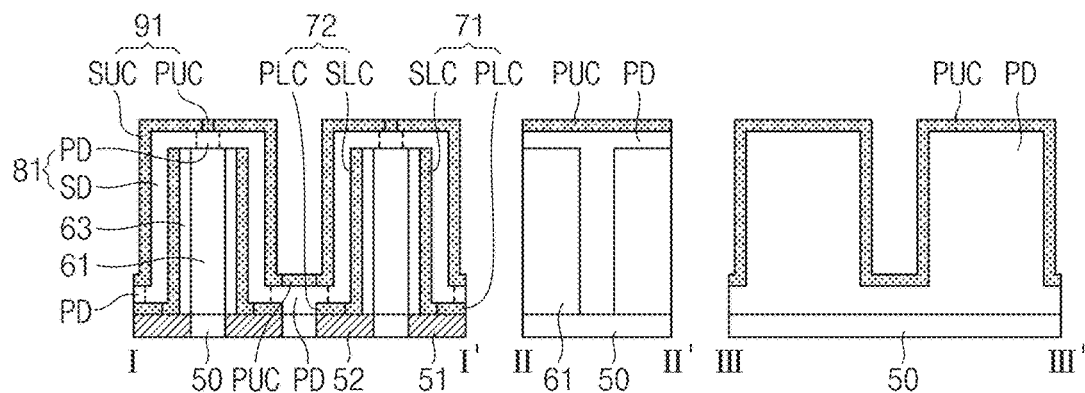

Referring to FIGS. 4 and 41, the upper electrode 91 may be formed on the capacitor dielectric layer 81. The upper electrode 91 may include monocrystalline perovskite upper conductive layers SUC and a polycrystalline perovskite upper conductive layer PUC.

The monocrystalline perovskite upper conductive layers SUC may be formed relatively close to the monocrystalline perovskite dielectric layers SD compared to the polycrystalline perovskite upper conductive layer PUC. The polycrystalline perovskite upper conductive layer PUC may be in continuity with or may be connected to the monocrystalline perovskite upper conductive layers SUC. The monocrystalline perovskite upper conductive layers SUC and the polycrystalline perovskite upper conductive layer PUC may include SrRuO3, BaSnO3, (La, Sr)CoO3, (La, Sr)CuO3, (La, Sr)MnO3, LaNiO3, SrSnO3, SrMoO3, or a combination thereof. For example, the upper electrode 91 may include an SrRuO3 layer.

In an example embodiment, formation of the upper electrode 91 may include a process of depositing a thin film and a process of crystallizing the thin film by applying laser annealing thereto. In an example embodiment, the upper electrode 91 may be formed by using an epitaxial growth technique.

In an example embodiment, during the process of forming the upper electrode 91, the monocrystalline perovskite dielectric layers SD may serve to induce crystallization of the monocrystalline perovskite upper conductive layers SUC. The monocrystalline perovskite upper conductive layers SUC may grow in crystal directions of the monocrystalline perovskite dielectric layers SD and also in a lateral direction to the crystal directions. The monocrystalline perovskite upper conductive layers SUC may slightly extend outward from the monocrystalline perovskite dielectric layers SD. The monocrystalline perovskite upper conductive layers SUC may have a greater width than the monocrystalline perovskite dielectric layers SD. The monocrystalline perovskite upper conductive layers SUC may have a greater width than the seed layers 63. Boundaries between the monocrystalline perovskite upper conductive layers SUC and the polycrystalline perovskite upper conductive layer PUC may be formed on the outside of the monocrystalline perovskite dielectric layers SD.

Figure 42:
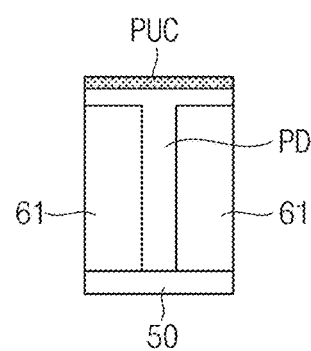
FIGS. 42 and 43 are partial diagrams showing parts of FIG. 41.
Figure 43:
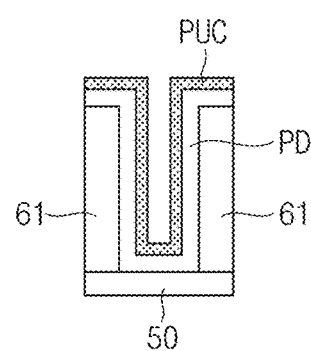

FIGS. 42 and 43 are partial diagrams showing parts of FIG. 41.

Referring to FIGS. 4, 5, 41, and 42, the insulating patterns 61 may be spaced apart from each other in the row direction and the column direction. In the column direction, the polycrystalline perovskite dielectric layer PD may completely fill gaps between the insulating patterns 61. Profiles of the polycrystalline perovskite dielectric layer PD and the polycrystalline perovskite upper conductive layer PUC may be controlled by adjusting a column-direction interval between the insulating patterns 61 and a thickness of the polycrystalline perovskite dielectric layer PD. Parts of the polycrystalline perovskite upper conductive layer PUC may be formed at a higher level than the upper surfaces of the insulating patterns 61.

Referring to FIGS. 4, 5, 41, and 43, in the column direction, the polycrystalline perovskite dielectric layer PD may conformally cover side surfaces of the insulating patterns 61. Profiles of the polycrystalline perovskite dielectric layer PD and the polycrystalline perovskite upper conductive layer PUC may be controlled by adjusting a column-direction interval between the insulating patterns 61 and a thickness of the polycrystalline perovskite dielectric layer PD. Between the insulating patterns 61, parts of the polycrystalline perovskite upper conductive layer PUC may conformally cover the upper surface of the polycrystalline perovskite dielectric layer PD.

Referring back to FIG. 1, additional electrodes 96, an upper insulating layer 97, upper contact plugs 98, and an upper interconnection 99 may be formed on the upper electrode 91.

Figure 44:
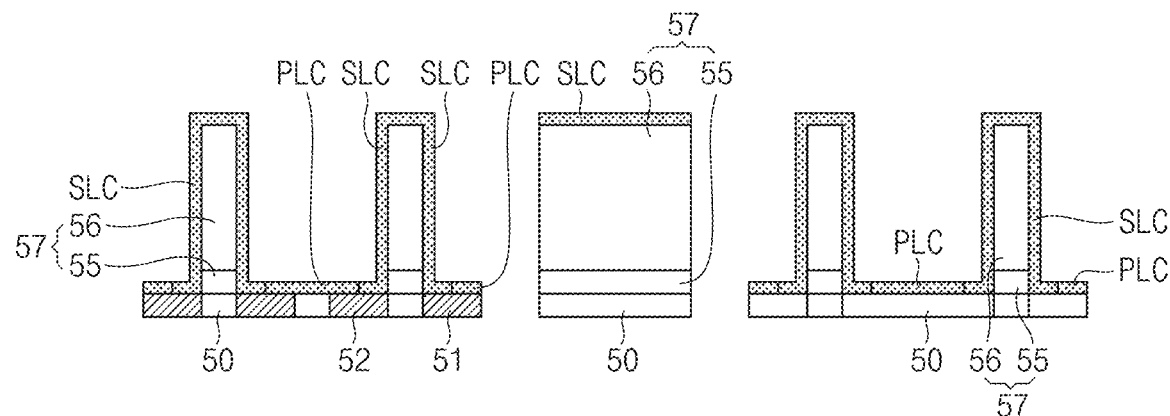
FIGS. 44, 46, and 48 are cross-sectional views illustrating a method of fabricating a semiconductor device according to some example embodiments of the present inventive concepts.
Figure 45:
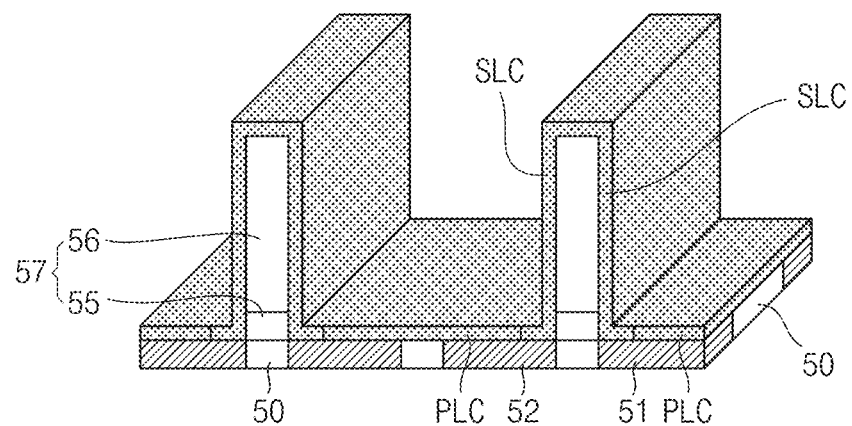
FIGS. 45 and 47 are perspective views illustrating a method of fabricating a semiconductor device according to example embodiments of the present inventive concepts.
Figure 46:
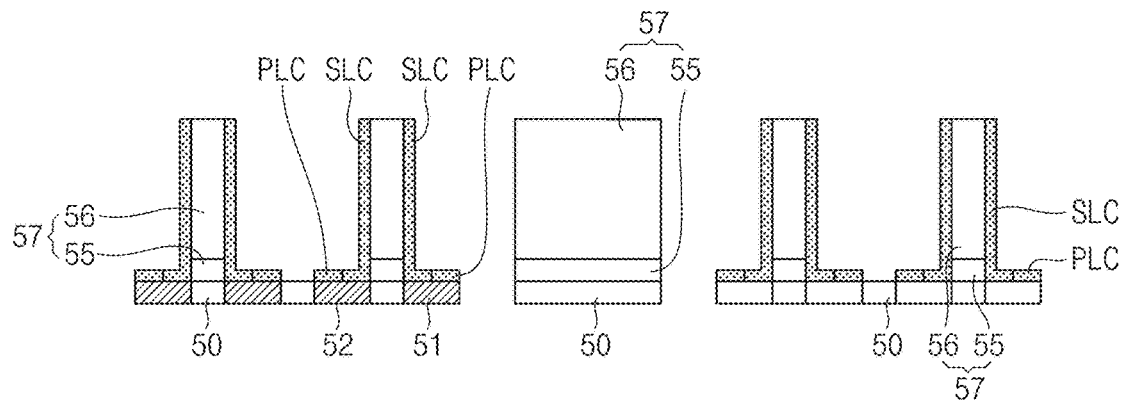
Figure 47:
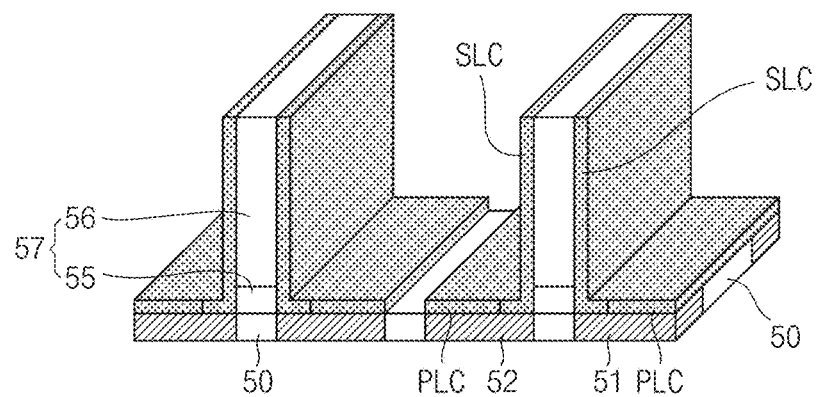
Figure 48:
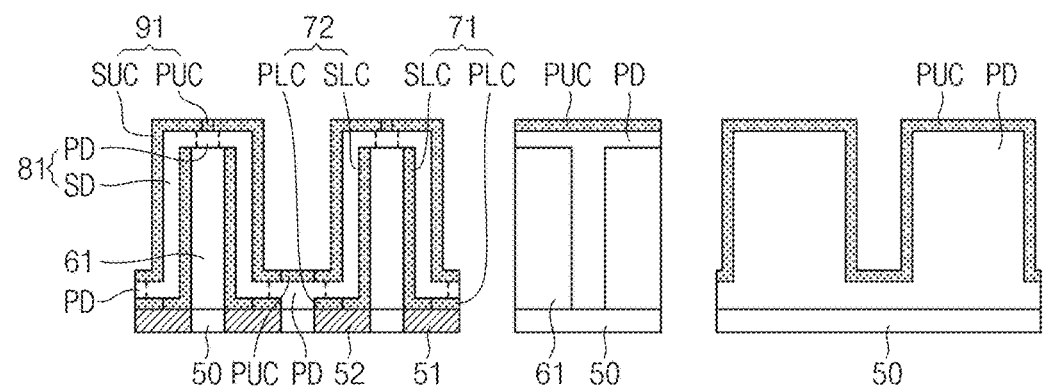

FIGS. 44, 46, and 48 are cross-sectional views illustrating a method of fabricating a semiconductor device according to some example embodiments of the present inventive concepts, and FIGS. 45 and 47 are perspective views according to the process operations of FIGS. 44, 46, and 48.

Referring to FIGS. 44 and 45, monocrystalline perovskite lower conductive layers SLC and polycrystalline perovskite lower conductive layers PLC may be formed to cover side surfaces and upper surfaces of the sacrificial patterns 57 and cover the plurality of conductive pads 51 and 52 and the pad isolation layer 50. The monocrystalline perovskite lower conductive layers SLC may be formed relatively close to the sacrificial patterns 57, compared to the polycrystalline perovskite lower conductive layers PLC. The monocrystalline perovskite lower conductive layers SLC may come in direct contact with the sacrificial patterns 57.

In an example embodiment, during the process of forming the monocrystalline perovskite lower conductive layers SLC and the polycrystalline perovskite lower conductive layers PLC, the sacrificial patterns 57 may serve to induce crystallization of the monocrystalline perovskite lower conductive layers SLC. The monocrystalline perovskite lower conductive layers SLC may grow in crystal directions of the sacrificial patterns 57 and also in a lateral direction to the crystal directions. The monocrystalline perovskite lower conductive layers SLC may slightly extend outward from the sacrificial patterns 57. The monocrystalline perovskite lower conductive layers SLC may have a greater width than the sacrificial patterns 57. Boundaries between the monocrystalline perovskite lower conductive layers SLC and the polycrystalline perovskite lower conductive layers PLC may be formed on the plurality of conductive pads 51 and 52. Lower end portions of the monocrystalline perovskite lower conductive layers SLC and lower surfaces of the polycrystalline perovskite lower conductive layers PLC may come in direct contact with upper surfaces of the plurality of conductive pads 51 and 52.

Referring to FIGS. 46 and 47, the upper surfaces of the sacrificial patterns 57 and some of the pad isolation layer 50 may be exposed by partially removing the monocrystalline perovskite lower conductive layers SLC and the polycrystalline perovskite lower conductive layers PLC.

Referring to FIGS. 8, 9, and 48, the capacitor dielectric layer 81 may be formed to cover upper surfaces of the plurality of lower electrodes 71 and 72, the insulating patterns 61, and the pad isolation layer 50. The process of forming the plurality of lower electrodes 71 and 72 and the insulating patterns 61 may include the same or substantially similar process operations to the operations described above with reference to FIGS. 29 to 43. The capacitor dielectric layer 81 may include the monocrystalline perovskite dielectric layers SD and the polycrystalline perovskite dielectric layer PD. The upper electrode 91 may be formed on the capacitor dielectric layer 81. The upper electrode 91 may include the monocrystalline perovskite upper conductive layers SUC and the polycrystalline perovskite upper conductive layer PUC.

According to the example embodiments of the present inventive concepts, a capacitor in which a monocrystalline perovskite dielectric layer is interposed between monocrystalline perovskite electrode layers is provided. Application of the monocrystalline perovskite dielectric layer may remarkably increase capacitance of the capacitor. A semiconductor device including a capacitor having increased capacitance and reduced leakage current may be implemented.

Although the example embodiments of the present inventive concepts have been described with reference to the accompanying drawings, those of ordinary skill in the art to which the present inventive concepts pertain would appreciate that the present inventive concepts may be implemented in other example embodiments without departing from the technical spirit and essential features thereof. Thus, the above-described example embodiments are intended to show at least some aspects of the present inventive concepts.

What is claimed is:

1. A semiconductor device comprising:
a substrate;
an insulating layer on the substrate;
a contact structure in the insulating layer;
a lower electrode on the contact structure, the lower electrode including a horizontal portion extending in a first direction that is parallel to a top surface of the substrate and a vertical portion extending in a second direction that is perpendicular to the top surface of the substrate;
a dielectric layer on the lower electrode; and
an upper electrode on the dielectric layer,
wherein the horizontal portion of the lower electrode includes first to fourth side surfaces,
the vertical portion of the lower electrode contacts the first side surface of the horizontal portion of the lower electrode, and the dielectric layer contacts the second to fourth side surfaces of the horizontal portion of the lower electrode and covers a top surface of the vertical portion of the lower electrode.

2. The semiconductor device of claim 1, wherein
the first side surface of the horizontal portion of the lower electrode is opposite to the second side surface of the horizontal portion of the lower electrode, and
the third side surface of the horizontal portion of the lower electrode is opposite to the fourth side surface of the horizontal portion of the lower electrode.

3. The semiconductor device of claim 1, wherein the dielectric layer contacts a top surface of the horizontal portion of the lower electrode.

4. The semiconductor device of claim 1, wherein a width of the horizontal portion of the lower electrode in the first direction is greater than a height of the horizontal portion of the lower electrode in the second direction.

5. The semiconductor device of claim 1, wherein a width of the vertical portion of the lower electrode in the first direction is less than a height of the vertical portion of the lower electrode in the second direction.

6. The semiconductor device of claim 1, wherein a height of the vertical portion of the lower electrode in the second direction is greater than a width of the horizontal portion of the lower electrode in the first direction.

7. The semiconductor device of claim 1, wherein a width of the horizontal portion of the lower electrode in a third direction that is parallel to the top surface of the substrate and that is perpendicular to the first direction is substantially equal to a width of the vertical portion of the lower electrode in the third direction.

8. The semiconductor device of claim 1, wherein
the vertical portion of the lower electrode includes first to fourth side surfaces,
the first side surface of the vertical portion of the lower electrode is opposite to the second side surface of the vertical portion of the lower electrode, and
the third side surface of the vertical portion of the lower electrode is opposite to the fourth side surface of the vertical portion of the lower electrode.

9. The semiconductor device of claim 8, further comprising:
an insulating pattern on the insulating layer,
wherein the insulating pattern is connected to the first side surface of the vertical portion of the lower electrode.

10. The semiconductor device of claim 9, wherein the dielectric layer contacts the top surface of the vertical portion of the lower electrode and the second to fourth side surfaces of the vertical portion of the lower electrode.

11. The semiconductor device of claim 9, wherein a width of the insulating pattern in the first direction is less than a height of the insulating pattern in the second direction.

12. The semiconductor device of claim 9, wherein a top surface of the insulating pattern is substantially coplanar with the top surface of the vertical portion of the lower electrode.

13. The semiconductor device of claim 1, further comprising:
a gate electrode fully buried in the substrate.

14. The semiconductor device of claim 1, wherein the dielectric layer includes a monocrystalline dielectric layer that is adjacent to the vertical portion of the lower electrode and a polycrystalline dielectric layer that is adjacent to the horizontal portion of the lower electrode.

15. A semiconductor device comprising:
a substrate;
an insulating layer on the substrate;
a first contact structure and a second contact structure in the insulating layer, the first contact structure arranged adjacent to the second contact structure and spaced apart from the second contact structure by the insulating layer;
a first lower electrode on the first contact structure, the first lower electrode including a first horizontal portion extending in a first direction that is parallel to a top surface of the substrate and a first vertical portion extending in a second direction that is perpendicular to the top surface of the substrate;
a second lower electrode on the second contact structure, the second lower electrode including a second horizontal portion extending in the first direction and a second vertical portion extending in the second direction, the second vertical portion of the second lower electrode facing the first vertical portion of the first lower electrode;
an insulating pattern on the insulating layer, and between the first vertical portion of the first lower electrode and the second vertical portion of the second lower electrode;
a dielectric layer on the insulating pattern, the first lower electrode and the second lower electrode; and
an upper electrode on the dielectric layer,
wherein the first horizontal portion of the first lower electrode includes first to fourth side surfaces,
the first vertical portion of the first lower electrode contacts the first side surface of the first horizontal portion of the first lower electrode,
the second to fourth side surfaces and a top surface of the first horizontal portion of the first lower electrode contact the dielectric layer,
the second horizontal portion of the second lower electrode includes fifth to eighth side surfaces,
the second vertical portion of the second lower electrode contacts the fifth side surface of the second horizontal portion of the second lower electrode,
the sixth to eighth side surfaces and a top surface of the second horizontal portion of the second lower electrode contact the dielectric layer, and
the dielectric layer covers a top surface of the insulating pattern.

16. The semiconductor device of claim 15, wherein the top surface of the insulating pattern is substantially coplanar with a top surface of the first vertical portion of the first lower electrode and/or a top surface of the second vertical portion of the second lower electrode.

17. The semiconductor device of claim 15, wherein
one of the first vertical portion of the first lower electrode and the second vertical portion of the second lower electrode includes first to fourth side surfaces,
the first side surface of the one of the first vertical portion of the first lower electrode and the second vertical portion of the second lower electrode is connected to the insulating pattern, and
the second to fourth side surfaces of the one of the first vertical portion of the first lower electrode and the second vertical portion of the second lower electrode contact the dielectric layer.

18. A semiconductor device comprising:
a substrate;
an insulating layer on the substrate;
a first contact structure and a second contact structure in the insulating layer, the first contact structure arranged adjacent to the second contact structure and spaced apart from the second contact structure by the insulating layer;
a first lower electrode on the first contact structure, the first lower electrode including a first horizontal portion extending in a first direction that is parallel to a top surface of the substrate and a first vertical portion extending in a second direction that is perpendicular to the top surface of the substrate;
a second lower electrode on the second contact structure, the second lower electrode including a second horizontal portion extending in the first direction and a second vertical portion extending in the second direction, the second vertical portion of the second lower electrode facing the first vertical portion of the first lower electrode;
a dielectric layer on the first lower electrode and the second lower electrode, and between the first vertical portion of the first lower electrode and the second vertical portion of the second lower electrode; and
an upper electrode on the dielectric layer, and between the first vertical portion of the first lower electrode and the second vertical portion of the second lower electrode,
wherein the first horizontal portion of the first lower electrode includes first to fourth side surfaces,
the first vertical portion of the first lower electrode contacts the first side surface of the first horizontal portion of the first lower electrode, and
the dielectric layer contacts the second to fourth side surfaces of the first horizontal portion of the first lower electrode.

19. The semiconductor device of claim 18, wherein
the second horizontal portion of the second lower electrode includes fifth to eighth side surfaces,
the second vertical portion of the second lower electrode contacts the fifth side surface of the second horizontal portion of the second lower electrode, and
the dielectric layer contacts the sixth to eighth side surfaces of the second horizontal portion of the second lower electrode.

20. The semiconductor device of claim 19, wherein
the dielectric layer contacts a top surface of each of the first horizontal portion of the first lower electrode and the second horizontal portion of the second lower electrode, a first side surface of the first vertical portion of the first lower electrode, and a second side surface of the second vertical portion of the second lower electrode, and
the first side surface of the first vertical portion of the first lower electrode faces the second side surface of the second vertical portion of the second lower electrode.

* * * * *